(12) United States Patent
Abe et al.

(10) Patent No.: US 6,424,504 B1
(45) Date of Patent: Jul. 23, 2002

(54) MICROACTUATOR, MAGNETIC HEAD DEVICE, AND MAGNETIC RECORDING APPARATUS

(75) Inventors: Munemitsu Abe, Miyagi-ken (JP); Masayoshi Esashi, c/o Alps Electric Co., Ltd. 1-7 Yukigaya, Otsuka-Cho, Ota-ku, Tokyo (JP)

(73) Assignees: Alps Electric Co., Ltd.; Masayoshi Esashi, both of Tokyo (JP)

( * ) Notice: Subject to any disclaimer, the term of this patent is extended or adjusted under 35 U.S.C. 154(b) by 0 days.

(21) Appl. No.: 09/326,195

(22) Filed: Jun. 4, 1999

(30) Foreign Application Priority Data

Jun. 16, 1998 (JP) ............................................. 10-168933

(51) Int. Cl.[7] .......................... G11B 5/56; G11B 21/24; H02N 1/00
(52) U.S. Cl. ..................................... 360/294.4; 310/309
(58) Field of Search .......................... 360/294.4, 294.3; 310/309, 40 MM, 22, 29, 313 B, 313 C, 365, 366

(56) References Cited

U.S. PATENT DOCUMENTS

| | | | | |
|---|---|---|---|---|
| 5,025,346 A | * | 6/1991 | Tang et al. ............... | 361/283.1 |
| 5,055,731 A | * | 10/1991 | Nihei et al. .................. | 310/309 |
| 5,303,105 A | | 4/1994 | Jorgenson | |
| 5,313,352 A | | 5/1994 | Chikazawa et al. | |
| 5,640,133 A | * | 6/1997 | MacDonald et al. ......... | 333/197 |
| 5,753,911 A | * | 5/1998 | Yasuda et al. ............... | 250/306 |
| 5,793,560 A | * | 8/1998 | Mizoshita et al. ........ | 360/78.12 |
| 5,801,472 A | * | 9/1998 | Wada et al. .................. | 310/309 |
| 5,898,541 A | * | 4/1999 | Boutaghou et al. .......... | 360/109 |
| 5,920,978 A | * | 7/1999 | Koshikawa et al. ...... | 29/603.12 |
| 5,998,906 A | * | 12/1999 | Jerman et al. ............... | 310/309 |
| 6,088,907 A | * | 7/2000 | Lee et al. ................. | 29/603.03 |
| 6,133,670 A | * | 10/2000 | Rodgers et al. .............. | 310/309 |

FOREIGN PATENT DOCUMENTS

| | | | |
|---|---|---|---|
| JP | 4-368479 | * | 12/1992 |
| JP | 8-033361 | * | 2/1996 |

* cited by examiner

*Primary Examiner*—William Klimowicz
(74) *Attorney, Agent, or Firm*—Brinks Hofer Gilson & Lione

(57) ABSTRACT

In a microactuator, a fixed substrate and a movable substrate are placed to be spaced opposed to each other. Between these substrates, a plurality of actuators are arranged to provide different moving distances. The actuators include comb-like movable electrodes formed on the movable substrate, and fixed electrodes formed on the fixed substrate, and having a plurality of teeth that extend outside the leading ends of the teeth of the movable electrodes in an undriven state. The movable substrate is allowed to move so that the leading ends of the teeth of the movable electrodes reach the outer ends of the teeth of the fixed electrodes. The portions of the fixed electrode teeth, which extend outside the movable electrode teeth, are different in length among the actuators.

8 Claims, 24 Drawing Sheets

MICROACTUATOR, MAGNETIC HEAD DEVICE, AND MAGNETIC RECORDING APPARATUS

BACKGROUND OF THE INVENTION

1. Field of the Invention

The present invention relates to a microactuator, a magnetic head device, and a magnetic recording apparatus, and more particularly, to the structure of a microactuator that is incorporated in a magnetic head device and that is suitable for use in finely adjusting the position of a magnetic head when the magnetic head is precisely positioned over a track on a magnetic recording medium.

2. Description of the Related Art

A typical magnetic recording apparatus includes a magnetic recording medium having a data recording surface, such as a magnetic disk, and comprises a magnetic head for writing on and reading information from the magnetic recording medium, a head support section for supporting the magnetic head, including a slider, a gimbal, and the like, a head driving section, such as a voice coil motor, for driving the support section to position the magnetic head with respect to a predetermined track on the magnetic recording medium, and the like. Even when the voice coil motor operation is very precise, however, the positioning of the magnetic head only by the voice coil motor limits positional accuracy, especially for finer track widths. Accordingly, a method has been proposed in which the head position is finely adjusted by using a precise actuator after coarse adjustment by a voice coil motor.

FIGS. 25 and 26 show an example of a conventional high-precision actuator that is capable of micromovement. An actuator 101 shown in FIGS. 25 and 26 uses electrostatic attractive force as the driving force, and is generically referred to as an "electrostatic actuator". In the electrostatic actuator 101, two substrates, a first substrate 102 and a second substrate 103, are spaced opposed to each other so as to allow relative motion. A first comb-like electrode 104 having a plurality of parallel teeth 104a is formed on a surface 102a of the first substrate 102 facing the second substrate 103, and a second electrode 105 having a plurality of parallel teeth 105a, which are placed between the adjoining teeth 104a of the first electrode 104, is formed on a surface 103a of the second substrate 103 facing the first substrate 102.

In the electrostatic actuator 101 having the above-described configuration, when voltage is applied between the first electrode 104 and the second electrode 105, electrostatic attractive force is generated therebetween, and causes the first substrate 102 and the second substrate 103 to move relative to each other so that the first electrode 104 and the second electrode 105 approach in a direction such that the degree of engagement increases between the first electrode teeth 104a and the second electrode teeth 105a. After that, when the voltage is cut off, since the electrostatic attractive force disappears, the first substrate 102 and the second substrate 103 move relative to each other so that the first electrode 104 and the second electrode 105 separate in the direction opposite from that at the time of voltage application, that is, in a direction such that the degree of engagement decreases between the first electrode teeth 104a and the second electrode teeth 105a.

As described above, the electrostatic actuator is driven by electrostatic attractive force generated between two substrates. A detailed description will be now given of the electrostatic attractive force between the substrates. It is believed that a force F1 acts to increase the area of the opposing portions of the faces of the first electrode and the second electrode in parallel to the direction of relative motion between the substrates when voltage is applied, and that a force F2 acts so that approaching and separating faces of the first electrode and the second electrode attract each other when voltage is applied. An electrostatic attractive force F serving as the driving force is the resultant of F1 and F2. The forces F1 and F2 are given by the following expressions, respectively:

$$F1 = (\epsilon_0 \cdot V^2 \cdot t)/g_1 \quad (1)$$

$$F2 = (\epsilon_0 \cdot V^2 \cdot S)/g_2^2 \quad (2)$$

where $\epsilon_0$ is the dielectric constant of a vacuum, $g_1$ is the distance between the faces of the electrodes in parallel with the direction of relative motion between the substrates, t is the electrode thickness, S is the area of the approaching and separating faces of the electrodes, and $g_2$ is the distance between the approaching and separating face of the electrodes.

In a case in which the first electrode and the second electrode are placed somewhat apart from each other, F1 is generally dominant because F2 significantly decreases.

When it is assumed that the driving force F is equal to F, the dielectric constant $\epsilon_0$ of a vacuum and the electrode thickness t are constant, and the distance $g_1$ between the faces of the electrodes parallel to the direction of relative motion between the substrates remains constant even when the electrodes move relative to each other. Therefore, the driving force F varies only according to the voltage V between the electrodes. For example, when this electrostatic actuator is adopted in a magnetic head device to finely adjust the head position, the substrate moving distance is controlled by controlling the driving force through the adjustment of the voltage between the electrodes. Therefore, it is necessary to previously take into consideration the relationship between the voltage and the driving force and the relationship between the driving force and the moving distance in individual actuators. Furthermore, there is a need for a system for controlling the substrate moving distance, including a voltage adjustment mechanism, which is relatively complicated. In particular, a conventional device requires a complicated moving distance control system in order to achieve stepwise micromovement, and there has been a demand for an electrostatic actuator that can simplify such a control system.

SUMMARY OF THE INVENTION

The present invention has been made to solve the above problems, and it is accordingly an object of the present invention to provide an electrostatic microactuator that can simplify a system for controlling the moving distance, compared with the conventional microactuator, and a magnetic head device and a magnetic recording apparatus using the microactuator.

In order to achieve the above object, according to an aspect of the present invention, there is provided a microactuator wherein opposing substrates are spaced so as to move relative to each other, and a plurality of actuators for providing different distances of relative motion between the substrates are arranged between the substrates at predetermined intervals in the direction of relative motion between the substrates.

Although microactuators having a plurality of actuators to produce a strong driving force have been known hitherto, the actuators provide the same relative moving distance, and a complicated system is needed to control the relative moving distance. In contrast, since a plurality of actuators, which provide different relative moving distances are arranged between the opposing substrates in the microactuator of the present invention, only the actuator that provides a required relative moving distance can be operated, which makes it possible to change the relative moving distance of the substrates in a stepwise manner without using any complicated control system.

In a specific structure in which a plurality of actuators are provided to provide different relative moving distances, each of the actuators comprises a first comb-like electrode formed on the opposing face of the first substrate, and having a plurality of parallel teeth aligned at the leading ends thereof; and a second electrode formed on the opposing face of the second substrate, and having a plurality of parallel teeth aligned at the leading ends thereof so as to be placed between the adjoining teeth of the first electrode and to extend outside the leading ends of the teeth of the first electrode in an undriven state, the outer ends of the extending portions of the plurality of teeth being moved to the leading ends of the teeth of the first electrode in a driven state in order to cause the substrates to move relative to each other. The outside extending portions of the second electrode teeth are different in length among the actuators.

In the case of the above-described conventional electrostatic microactuator, an electrode pair formed by the first electrode and the second electrode can be regarded as an actuator. The driving force F1 in the faces of the first electrode and the second electrode in parallel with the direction of relative motion between the substrates acts to increase the opposing area of the faces when voltage is applied. In this case, the maximum relative moving distance of the substrates is determined by the length (area) of the portions of the second electrode teeth that extend outside the leading ends of the first electrode teeth in an undriven state. Therefore, when the extending portions of the second electrode teeth are made different in length among the actuators, it is possible to achieve a structure in which a plurality of actuators are provided that provide different relative moving distance of the substrates. Even when the same voltage is applied to the actuators, as long as the voltage is set at a sufficient voltage to obtain the maximum relative moving distance in a driven state, the relative moving distance of the substrates differs among the actuators.

In other words, the conventional microactuator adjusts the moving distance by controlling the voltage to be applied between the electrodes, whereas the microactuator of the present invention adjusts the moving distance by switching among a plurality of actuators. Therefore, according to the microactuator of the present invention, there is no need to adjust the applied voltage in order to control the moving distance of the substrates.

In the microactuator of the present invention, it is preferable that approaching and separating faces of the first electrode and the second electrode, which are opposed to each other, not be parallel. The "approaching and separating faces" mean opposing faces of the first and second electrodes that approach or separate when the first and second electrode move relative to each other with the movement of the substrate.

As described above, in the conventional electrostatic actuator including the first comb-like electrode having a plurality of teeth and a second electrode having a plurality of teeth that are placed between the adjoining teeth of the first electrode, the force F2, by which the approaching and separating faces attract each other of the first and second electrodes, acts when the first electrode and the second electrode approach at the time of voltage application. According to the present invention, since the opposing approaching and separating faces of the first electrode and the second electrode are not parallel to each other, the force F2 can be thereby reduced. This results in a reduced influence of F2 that tends to rapidly increase with the approach of the electrodes, and the total electrostatic attractive force, namely, the driving force F can be made more constant, compared with the conventional actuator.

In order that "the opposing approaching and separating faces of the first electrode and the second electrode are not parallel to each other", as described above, for example, (1) both the opposing approaching and separating faces of the first electrode and the second electrode are convexly shaped to taper off toward the end, (2) the approaching and separating faces of one of the first and second electrodes are concavely shaped to broaden toward the end, and the approaching and separating faces of the other electrode are made flat, or (3) the approaching and separating faces of one of the first and second electrodes are convexly shaped to taper off toward the end, and the approaching and separating faces of the other electrode are made flat. In order to give priority to the advantage of the constant driving force F, the form (1), in which both the electrodes do not include flat faces, is the most preferable, and the forms (2) and (3) are equivalent to each other.

Since a substantial driving force F can be obtained, the preference increases in the following order: the form (2) including concave faces broadening toward the end and flat faces, the form (3) including convex faces tapering off toward the end and flat faces, and the form (1) including convex faces tapering off toward the end, although this slightly impairs the advantage of making the driving force F constant.

The substrates that are constituents of the microactuator of the present invention may be made of, for example, a glass substrate, a glass-nickel-glass laminate substrate, or a silicon-nickel-glass laminate substrate. The electrodes may be made of, for example, silicon having conductivity, and may be adhered to the glass substrate. As will be described in detail later, an actual microactuator requires, in addition to the substrates and electrodes, a component that functions as a spring for moving the substrates relative to each other in a direction such that the teeth of the electrodes approach when voltage is applied, and for subsequently returning the substrates to the position before the voltage was applied when the voltage is cut off. In this case, the spring portion may be made of silicon, and may be subjected to working together with the electrodes. Furthermore, wires for applying voltage to the electrodes may be formed of metal, such as aluminum or platinum-titanium, on the substrates. Since there is a need to switch among the actuators in the present invention as necessary, the actuators must individually include wires for voltage application.

According to another aspect of the present invention, there is provided a magnetic head device including the above-described microactuator.

According to a further aspect of the present invention, there is provided a magnetic recording apparatus including the above magnetic head.

That is, the use of the microactuator including a plurality of actuators, which provide different working amounts, as described above, permits stepwise operation for finely adjusting the position of the magnetic head with respect to a predetermined track on a magnetic recording medium. The magnetic head device and the magnetic recording apparatus can control the shift amount of the microactuator by only employing a simple switching means, such as a switch, without using a complicated shift amount control system for the microactuator. This can make the device configuration simpler than before.

Further objects, features and advantages of the present invention will become apparent from the following description of the preferred embodiments with reference to the attached drawings.

DESCRIPTION OF THE PREFERRED EMBODIMENTS

A microactuator according to a first embodiment of the present invention will be described below with reference to FIGS. 1 to 6.

Figure 1:
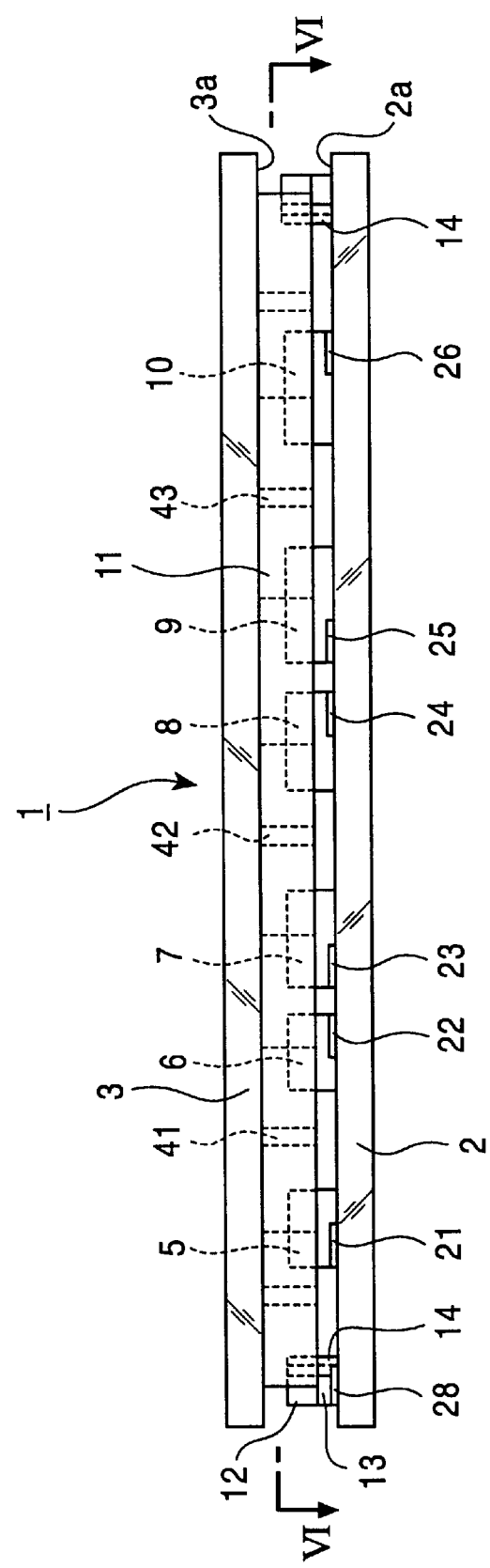
FIG. 1 is a front view of a microactuator according to a first embodiment of the present invention.
Figure 2:
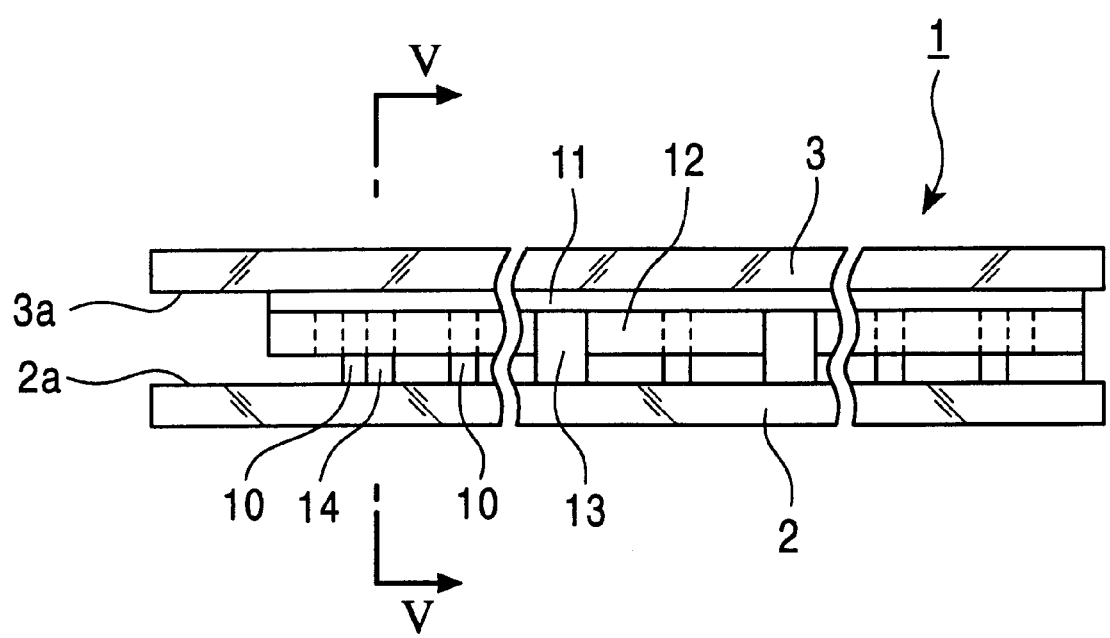
FIG. 2 is a side view of the microactuator.
Figure 3:
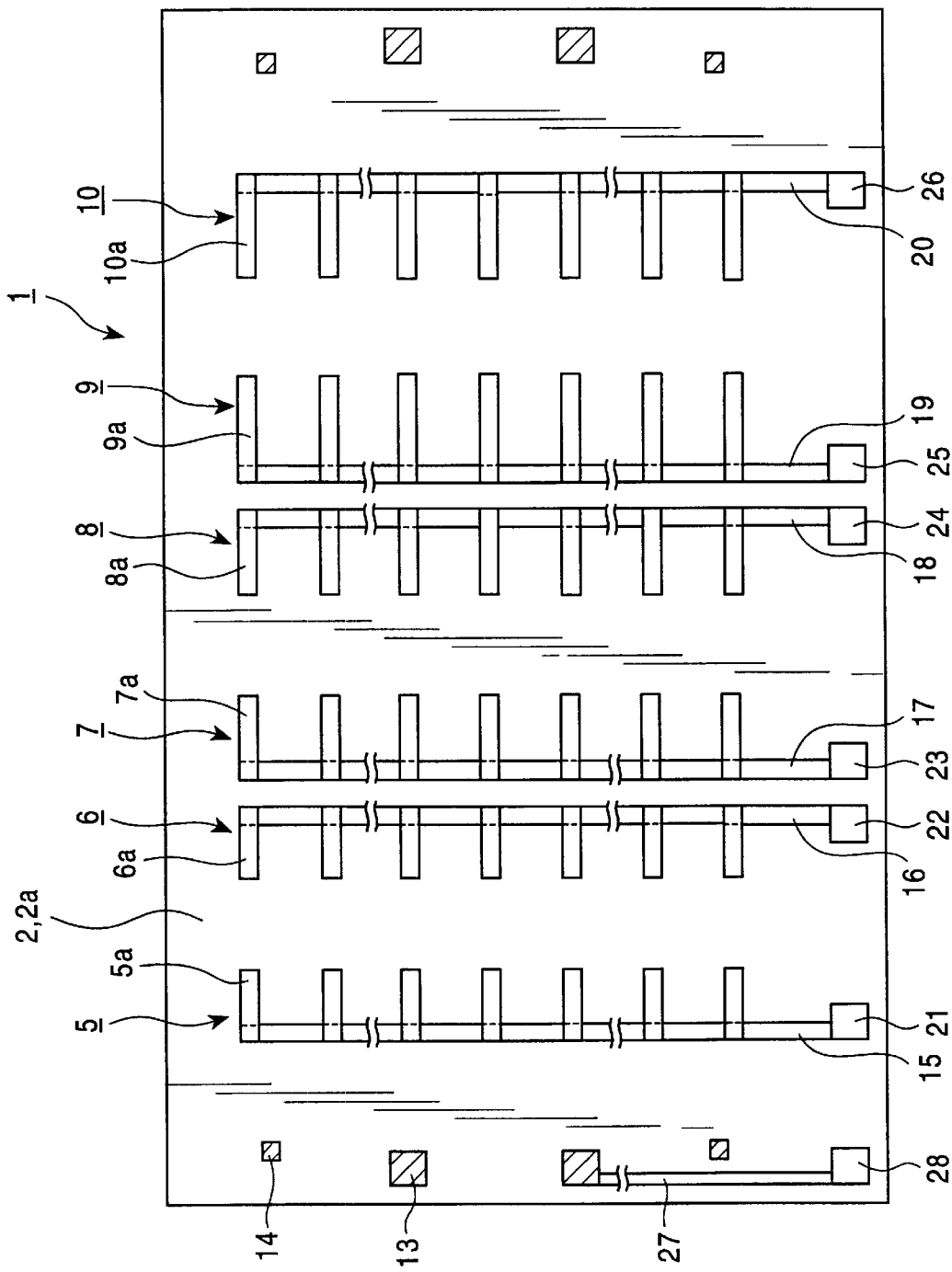
FIG. 3 is a plan view of a fixed substrate in the microactuator, as viewed from the top side.
Figure 4:
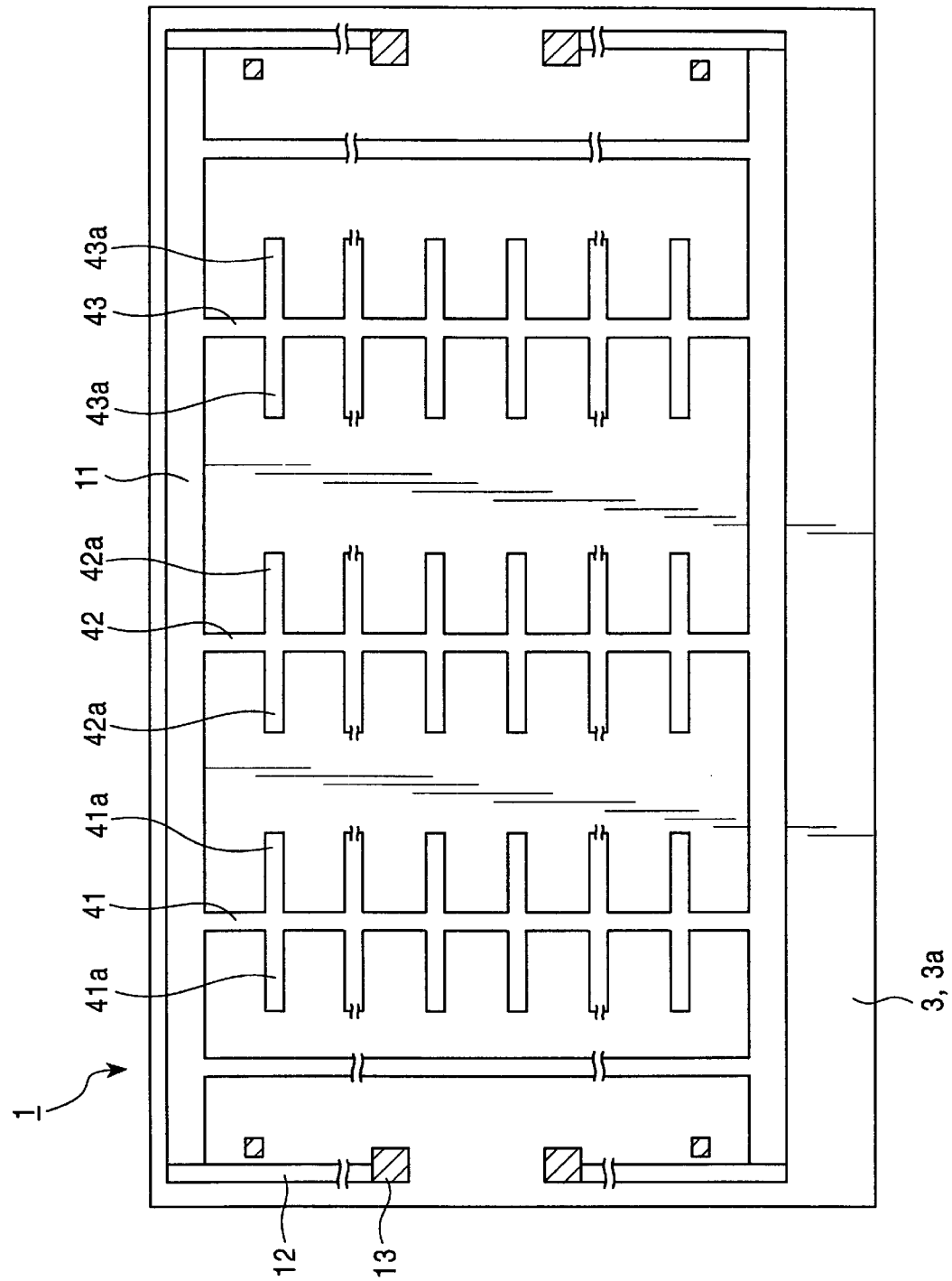
FIG. 4 is a plan view of a movable substrate in the microactuator, as viewed from the bottom side.
Figure 5:
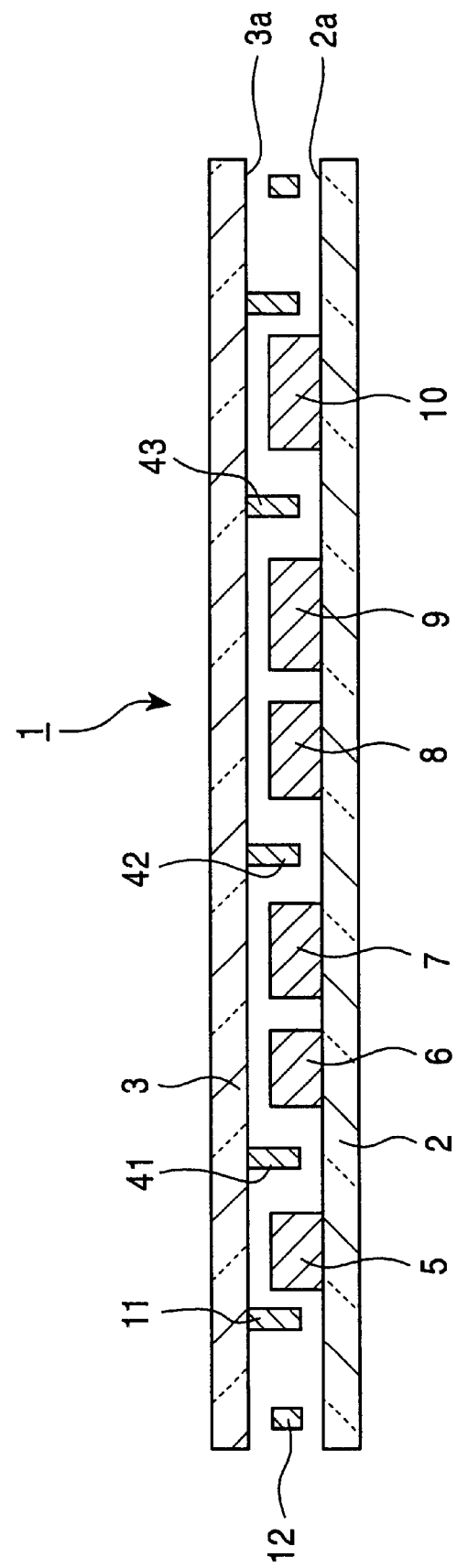
FIG. 5 is a longitudinal sectional view, taken along line V—V of FIG. 2.
Figure 6:
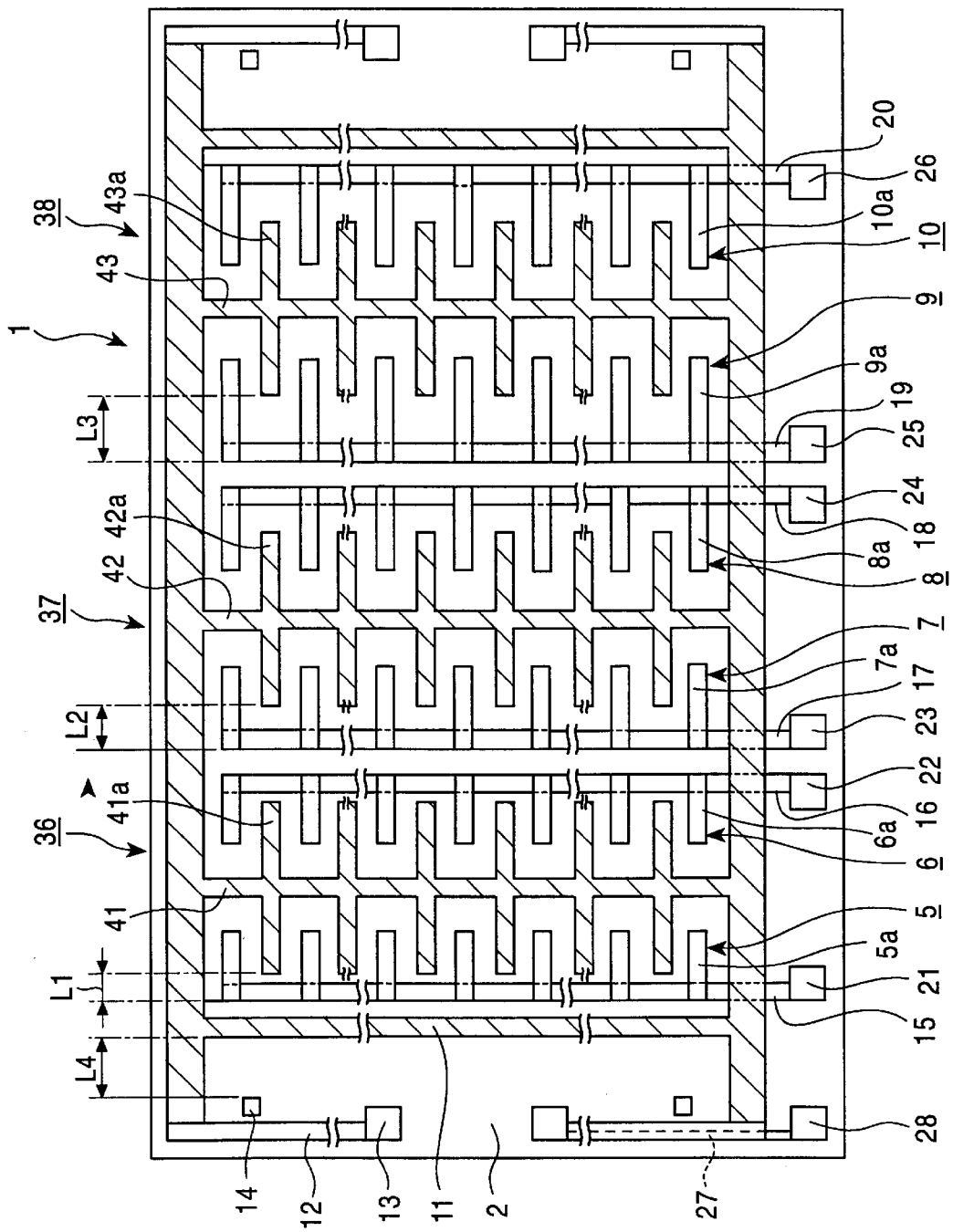
FIG. 6 is a horizontal sectional view, taken along line VI—VI of FIG. 1.

FIG. 1 is a front view of a microactuator 1 according to a first embodiment of the present invention, FIG. 2 is a side view of the microactuator 1, FIG. 3 is a plan view of a fixed substrate in the lower part of the microactuator 1 cut between two substrates, as viewed from the top side, FIG. 4 is a plan view of a movable substrate in the upper part of the microactuator 1 cut at the same position as that in FIG. 3, as viewed from the bottom side, FIG. 5 is a longitudinal sectional view, taken along line V—V of FIG. 2, and FIG. 6 is a horizontal sectional view, taken along line VI—VI of FIG. 1. The cutting position shown in FIGS. 3 and 4 is placed between the lower surface of a frame section and the upper surface of the fixed substrate, which will be described later.

The microactuator of the present invention has a structure in which a first substrate having a first electrode and a second substrate having a second electrode move relative to each other. In this embodiment, the microactuator 1 is incorporated in a magnetic head device so that the first substrate is movable and the second substrate is fixed. The first substrate, the second substrate, the first electrode, and the second electrode will be referred to as a "movable substrate", a "fixed substrate", a "movable electrode", and a "fixed electrode", respectively.

Referring to FIGS. 1 and 2, a fixed substrate 2 and a movable substrate 3 are placed to be spaced opposed to each other. Fixed electrodes 5 to 10 are mounted on an inner surface 2a (the surface facing the movable substrate 3) of the fixed substrate 2, and movable electrodes 41 to 43 are mounted on an inner surface 3a (the surface facing the fixed substrate 2) of the movable substrate 3. By applying voltage between the movable electrodes 41 to 43 and the fixed electrodes 5 to 10, the movable substrate 3 is moved so that the movable electrodes 41 to 43 approach the fixed electrodes 5 to 10. The fixed substrate 2 and the movable substrate 3 are formed of a glass substrate, and the fixed electrodes 5 to 10 and the movable electrodes 41 to 43 are made of a conductive material, for example, silicon.

As shown in FIGS. 4 and 6, the movable electrodes 41 to 43 form a comb-like structure, which include a plurality of teeth 41a to 43a, respectively, that are arranged in parallel and are aligned with one another at the leading ends thereof. In contrast, as shown in FIGS. 3 and 6, the fixed electrodes 5 to 10 include a plurality of teeth 5a to 10a, respectively, which are arranged in parallel and aligned at the outer ends thereof so as to be placed between the adjoining teeth 41a to 43a of the movable electrodes 41 to 43 and to extend outside the leading ends of the teeth 41a to 43a in an undriven state. The movable electrodes 41 and 43 have the teeth 41a to 43a that point to both the right and left sides of FIG. 6. The fixed electrodes 5 to 10 are arranged on both sides of the movable electrodes 41, 42, and 43, respectively. The fixed electrodes 6, 8, and 10, which are respectively placed on the right sides of the movable electrodes 41, 42, and 43 in FIG. 6, serve to move the movable substrate 3 in the rightward direction when voltage is applied, and the fixed electrodes 5, 7, and 9 placed on the left sides of the movable electrodes 41, 42, and 43 serve to move the movable substrate 3 in the leftward direction when voltage is applied.

The movable electrode 41 and the fixed electrodes 5 and 6 constitute an actuator 36, the movable electrode 42 and the fixed electrodes 7 and 8 constitute an actuator 37, and the movable electrode 43 and the fixed electrodes 9 and 10 constitute an actuator 38. That is, as shown in FIG. 6, the three actuators 36, 37, and 38 are arranged in the direction of relative motion between the substrates in the overall microactuator 1 of this embodiment. When voltage is applied between the movable electrodes 41 to 43 and the fixed electrodes 5 to 10, the movable substrate 3 moves in a direction such that the degree of engagement between the teeth increases, that is, in the longitudinal direction of the teeth. In this case, the length of the portions of the teeth 5a to 10a of the fixed electrodes 5 to 10, which extend outside the leading ends of the teeth 41a to 43a of the movable electrodes 41 to 43 in an undriven state, determines the moving distance of the substrate at the time of voltage application. In this embodiment, the teeth 5a to 10a of the fixed electrodes 5 to 10 vary in length among the actuators 36, 37, and 38. In particular, the lengths L1, L2, and L3 of the above-described extending portions of the fixed electrode teeth 5a to 10a are 1 $\mu$m, 2 $\mu$m, and 3 $\mu$m from the left side to the right side in FIG. 6, and these lengths are different among the actuators 36, 37, and 38. The movable electrodes 41 to 43 do not differ in size among the actuators 36, 37, and 38. In other words, the left actuator 36 serves to provide a moving distance of 1 $\mu$m, the center actuator 37 serves to provide a moving distance of 2 $\mu$m, and the right actuator 38 serves to provide a moving distance of 3 $\mu$m.

As shown in FIG. 3, silicon comprising the teeth 5a to 10a of the fixed electrodes 5 to 10 is disposed in isolation on the fixed substrate 2. In contrast, as shown in FIG. 4, silicon comprising all the movable electrodes 41 to 43 of the actuators 36, 37, and 38 is connected to a rectangular frame section 11. Support spring portions 12 extend from the corners of the frame section 11, and anchor portions 13 are provided at the leading ends thereof. That is, the movable electrodes 41 to 43, the frame section 11, the support spring portions 12, and the anchor portions 13 are integrally made of silicon. Between the support spring portions 12 and the frame section 11, stoppers 14 of silicon are provided. The stoppers 14 are placed closer to the frame section 11 than the anchor portions 13, and the distance L4 between the stoppers 14 and the frame section 11 is 3 $\mu$m. This is satisfactory as long as the distance L4 is equal to or more than the length L3 of the extending portion of the actuator 38 that provides the longest moving distance of the substrate, of the three actuators 36, 37, and 38 (L4≧L3).

As described above, the movable electrodes 41 to 43 are disposed on the inner surface 3a of the movable substrate 3 while the fixed electrodes 5 to 10 are disposed on the inner surface 2a of the fixed substrate 2. In a manner similar to the movable electrodes 41 to 43, the frame section 11 is also fixed on the inner surface 3a of the movable substrate 3, as shown in FIG. 4. Although the support spring portions 12 extend from the frame section 11, they are not fixed on either the fixed substrate 2 or the movable substrate 3, as shown in FIG. 5. The anchor portions 13 at the leading ends of the support spring portions 12 are fixed on the fixed substrate 2, as shown in FIG. 1. That is, the anchor portions 13 are fixed on the fixed substrate 2, and the frame section 11 and the movable electrodes 41 to 43 are fixed on the movable substrate 3 via the support spring portions 12, whereby the movable substrate 3 is supported with respect to the fixed substrate 2. The support spring portions 12, which are not fixed to either the fixed substrate 2 or the movable substrate 3, elastically deform because of the elasticity of silicon when the movable substrate 3 is moved by the application of voltage, and elastically return when the voltage is cut off so that the movable substrate 3 returns to the position before voltage was applied. The support spring portions 12 essentially function as springs.

Referring again to FIG. 3, the actuators 36, 37, and 38 are respectively provided with wires for applying voltage to the fixed electrodes 5 to 10. The actuators 36, 37, and 38 include wires 16, 18, and 20, respectively, for electrically connecting the teeth 6a, 8a, and 10a of the fixed electrodes 6, 8, and 10 placed on the right sides of the movable electrodes 41 to 43 so as to move the movable substrate 3 in the rightward direction in the figure. Similarly, wires 15, 17, and 19 for electrically connecting the teeth 5a, 7a, and 9a of the fixed electrodes 5, 7, and 9 placed on the left sides of the movable electrodes 41 to 43 are provided so as to move the movable substrate 3 in the leftward direction. These wires 15 to 20 are provided with pad electrodes (electrodes for rightward movement 22, 24, and 26, and electrodes for leftward movement 21, 23, and 25) for connection to a power supply.

The wires 15 to 20 are made of metal such as aluminum, and are arranged on the inner surface 2a of the fixed substrate 2 so as to be in contact with the fixed electrodes 5 to 10, as shown in FIG. 3. Since the movable electrodes 41 to 43 of the actuators 36, 37, and 38 are integrally made of silicon, a wire 27 for applying voltage to the movable electrodes 41 to 43 is commonly provided for the actuators 36, 37, and 38, as shown in FIG. 3. That is, on the fixed substrate 2, the wire 27 extends to the anchor portion 13 along one (the support spring portion 12 at the left bottom of FIG. 6) of the four support spring portions 12 shown in FIG. 6 so as to be electrically connected to the anchor portion 13 in order to apply voltage to the movable electrodes 41 to 43 via the anchor portion 13, the support spring portion 12, and the frame section 11. The wire 27 is also provided with a pad electrode (common electrode) 28 for connection to the power supply.

An equipotential pattern (not shown) made of metal, such as aluminum, is formed on the movable substrate inner surface 3a above the region, where silicon is disposed between the substrates, excluding silicon fixed on the movable substrate 3, for example, above the fixed substrate 2, the support spring portions 12, the anchor portions 13. In joining silicon to the movable substrate 3 by anode coupling in a manufacturing process that will be described later, the equipotential pattern serves to make the potential of the surface of the movable substrate 3 equal to that of silicon, thereby preventing silicon from being undesirably joined to the movable substrate 3.

Next, a description will be given of an example of the method of manufacturing the microactuator 1 having the above-described configuration. In the manufacturing process of the microactuator 1, a plurality of microactuators are collectively produced on the same substrate, and are then cut into individual elements.

First, a silicon substrate having conductivity is prepared, and is subjected to preprocess such as cleaning. Subsequently, a photoresist is applied on both surfaces of the silicon substrate, and the photoresist on the upper surface (the surface to be fixed on the movable substrate 3) is subjected to patterning to form a resist pattern. In this case, the photoresist is left to conform to the shape of the silicon portions to be fixed on the movable substrate 3, such as the frame section 11 and the movable electrodes 41 to 43. Next, the upper surface of the silicon substrate is etched by a predetermined depth by using RIE (Reactive Ion Etching), with the obtained resist pattern used as a mask.

Then, the photoresist is stripped, and a photoresist is applied again on both surfaces of the silicon substrate. This time, the photoresist on the lower surface (the surface to be fixed on the fixed substrate 2) is subjected to patterning to form a resist pattern. The photoresist is left to conform to the shape of the silicon portions to be fixed on the fixed substrate 2, such as the anchor portions 13, the stoppers 14, and the fixed electrodes 5 to 10. Next, the lower surface of the silicon substrate is etched by a predetermined depth by using RIE or by other method, with the resist pattern used as a mask, and the photoresist is stripped. Through the above-described process, the silicon substrate can be obtained that conforms to the shapes of the portions of the microactuator 1.

Separately, the fixed substrate 2 and the movable substrate 3 are produced. At this time, glass substrates are prepared, and are subjected to preprocess such as cleaning. Subsequently, an aluminum film is deposited on the upper surface of each of the glass substrates by sputtering. Then, a photoresist is applied thereon, patterning is performed to form a resist pattern, and the aluminum film is subjected to wet etching, with the obtained resist pattern used as a mask. As a result, the wires 15 to 20 for applying voltage to the movable electrodes 41 to 43 and the fixed electrodes 5 to 10 are formed on the glass substrate that serves as the fixed substrate 2. On the glass substrate that serves as the movable substrate 3, an equipotential pattern is formed to be used in anode coupling.

After that, the fixed substrate 2 and the silicon substrate, which have been produced separately, are joined to each other by anode coupling. The portions of the silicon substrate corresponding to the anchor portions 13, the stoppers 14, and the fixed electrodes 5 to 10 are joined to the fixed substrate 2. Next, a photoresist is applied on the upper surface of the silicon substrate, and is subjected to patterning. In this case, a resist pattern is formed so as to conform to the shapes of all the silicon portions to be formed between the substrates. Subsequently, the silicon substrate is subjected to etching using RIE or other methods, with the resist pattern used as a mask so as to be pierced.

Finally, the movable substrate 3 and the silicon substrate are joined by anode coupling, and the substrates including a plurality of elements (microactuators) collectively formed therein are cut into individual elements, whereby the microactuator 1 of this embodiment is completed.

Next, a description will be given of another example of the method of manufacturing the microactuator 1.

First, a silicon substrate having conductivity is prepared, and is subjected to preprocess such as cleaning. Subsequently, a photoresist is applied on both surfaces of the silicon substrate, and the photoresist on the lower surface is subjected to patterning. In this case, a resist pattern is formed so as to conform to the shapes of silicon portions to be fixed to the fixed substrate 2, such as the anchor portions 13, the stoppers 14, and the fixed electrodes 5 to 10. Next, the lower surface of the silicon substrate is etched by a predetermined depth by RIE or by other methods, with the resist pattern used as a mask, and the photoresist is then stripped off.

Next, both surfaces of the silicon substrate are oxidized by thermal oxidation or by other methods so that a $SiO_2$ film is formed thereon. Subsequently, a photoresist is applied on the upper surface of the silicon substrate, and is subjected to patterning to form a resist pattern, and the $SiO_2$ film on the upper surface of the silicon substrate is etched with the resist pattern used as a mask. The pattern of the $SiO_2$ film is formed so as to conform to the shapes of the silicon portions to be fixed to the movable substrate 3, such as the movable electrodes 41 to 43 and the frame section 11. In this case, the entire $SiO_2$ film on the lower surface of the silicon substrate is etched. After this etching of the $SiO_2$ film, the photoresist is stripped off.

Next, the silicon substrate subjected to the above-described processing is joined by anode coupling to the fixed substrate 2, in which the wires 15 to 20, and 27 are made of metal, such as aluminum, on the glass substrate.

Next, a photoresist is applied on the upper surface of the silicon substrate, and is patterned to form a resist pattern, and the silicon substrate is subjected to etching using RIE or other methods, with the resist pattern used as a mask, so as to be pierced. The pattern of the photoresist is formed so as to conform to the shapes of all the silicon portions to be formed between the fixed substrate 2 and the movable substrate 3. The photoresist is stripped off after etching. Subsequently, the upper surface of the silicon substrate is etched by a predetermined depth by RIE or by other methods, with the $SiO_2$ film formed thereon used as a mask, so that upper end faces of the fixed electrodes 5 to 10 and the support spring portions 12 are formed. After that, the $SiO_2$ film is removed by etching.

Finally, the movable electrodes 41 to 43 and the frame section 11 are anode-coupled to the movable substrate 3 which has been separately formed and in which wires of aluminum or the like are formed a glass substrate. Through the above-described process, the electrostatic actuator 1 is completed.

During use of this microactuator 1, a power supply is used that can output a voltage of at least approximately several tens of volts, a power supply terminal is connected to the rightward movement electrodes 22, 24, and 26 or the leftward movement electrodes 21, 23, and 25 in the microactuators 36, 37, and 38, and the common electrode 28 is grounded. The voltage of approximately several tens of volts means a sufficient voltages to obtain the maximum substrate moving distance (3 μm in this embodiment). Furthermore, a switching means, such as a switch, is provided between the rightward movement electrodes 22, 24, and 26 or the leftward movement electrodes 21, 23, and 25, and the power supply terminal. For example, in order to move the movable substrate 3 rightward by 1 μm, voltage is applied to the rightward movement electrode 22 of the actuator 36 on the left side of FIG. 6. Electrostatic attractive force is thereby generated via the wire 16 between the teeth 41a of the movable electrode 41 in the actuator 36 and the teeth 6a of the fixed electrode 6 placed on the right side thereof. The electrostatic attractive force serves as a driving force, and the movable substrate 3 moves rightward by 1 μm so that the leading ends of the teeth 41a of the movable electrode 41 reach the outer ends of the teeth 6a of the fixed electrode 6.

In order to move the movable substrate 3 leftward by 3 μm, the switch or the like is switched so that a voltage of approximately several tens of volts is applied to the leftward movement electrode 25 of the actuator 38 on the right side of FIG. 6. With this movement of the movable substrate 3, the support spring portions 12 elastically deform, and the frame section 11 also moves leftward by 3 μm. Since the distance L4 between the frame section 11 and the stoppers 14 is 3 μm, the frame section 11 abuts on the stoppers 14, and further movement of the movable substrate 3 is blocked. In either case, when the voltage is cut off, the electrostatic attractive force generated between the teeth 5a to 10a of the fixed electrodes and the teeth 41a to 43a of the movable electrodes disappears, and the support spring portions 12 elastically return, whereby the movable substrate 3 returns to the position before the voltage was applied.

In the microactuator 1 of this embodiment, the three actuators 36, 37, and 38 that provide different substrate moving distances are arranged on the same substrate. By switching among these actuators 36, 37, and 38, and by switching between the rightward movement and the leftward movement, stepwise movement is possible, which is performed in seven steps of 1 μm, 1 μm, 2 μm, and 3 μm in the rightward direction, 1 μm, 2 μm, and 3 μm in the leftward direction, and no shift. In this case, even when the same voltage is applied to the actuators 36, 37, and 38, as long as the voltage is set within the range of approximately several tens of volts, which is sufficient to obtain the maximum moving distance of 3 μm, different relative moving distances are obtained because of the operations of the actuators. That is, according to the microactuator 1 of this embodiment, there is no need to adjust the applied voltage in order to control the moving distance of the substrate. Therefore, the microactuator 1 of this embodiment can simplify the moving distance control system incorporated therein, compared with that of the conventional microactuator, and is suitable for use as an aligning mechanism or the like in a magnetic head device.

Next, a microactuator according to a second embodiment of the present invention will be described with reference to FIGS. 7 to 22.

In the microactuator 201 of the second embodiment, approaching and separating faces of a first electrode and a second electrode, which are opposed to each other, taper off. For plain explanation, only a single relative moving distance is provided.

Figure 9:
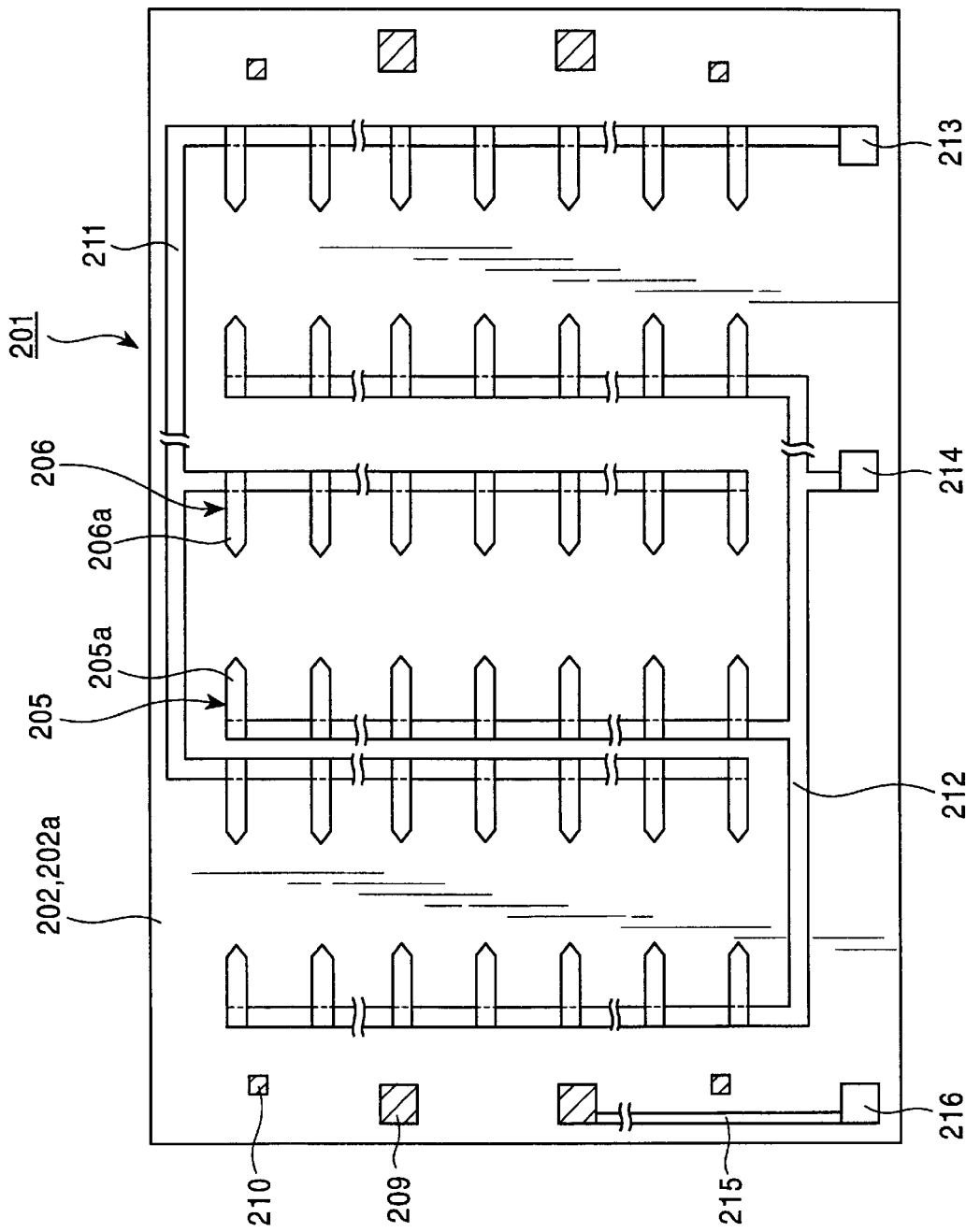
FIG. 9 is a plan view of a fixed substrate in the electrostatic actuator, as viewed from the top side.
Figure 10:
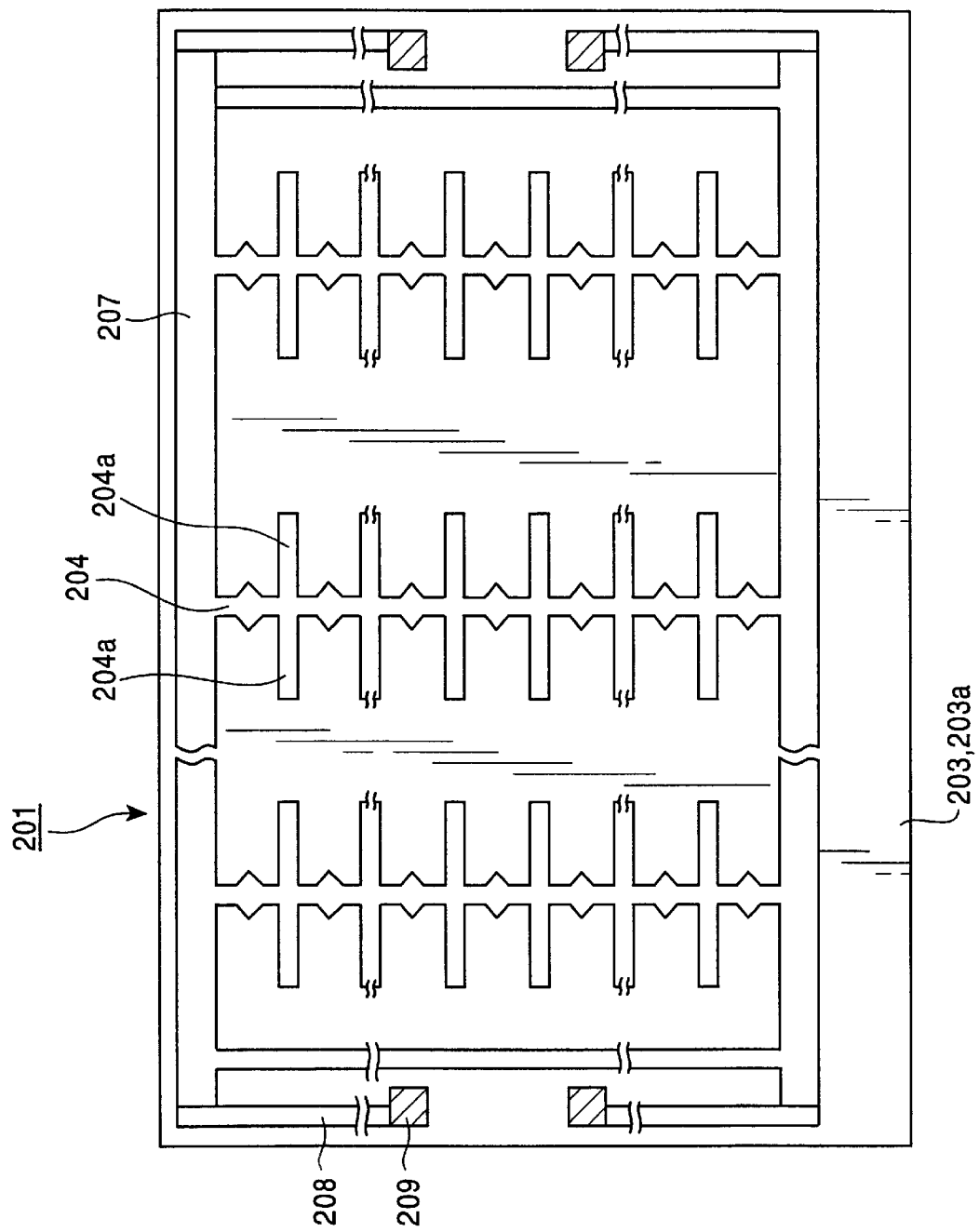
FIG. 10 is a plan view of a movable substrate in the electrostatic actuator, as viewed from the bottom side.
Figure 11:
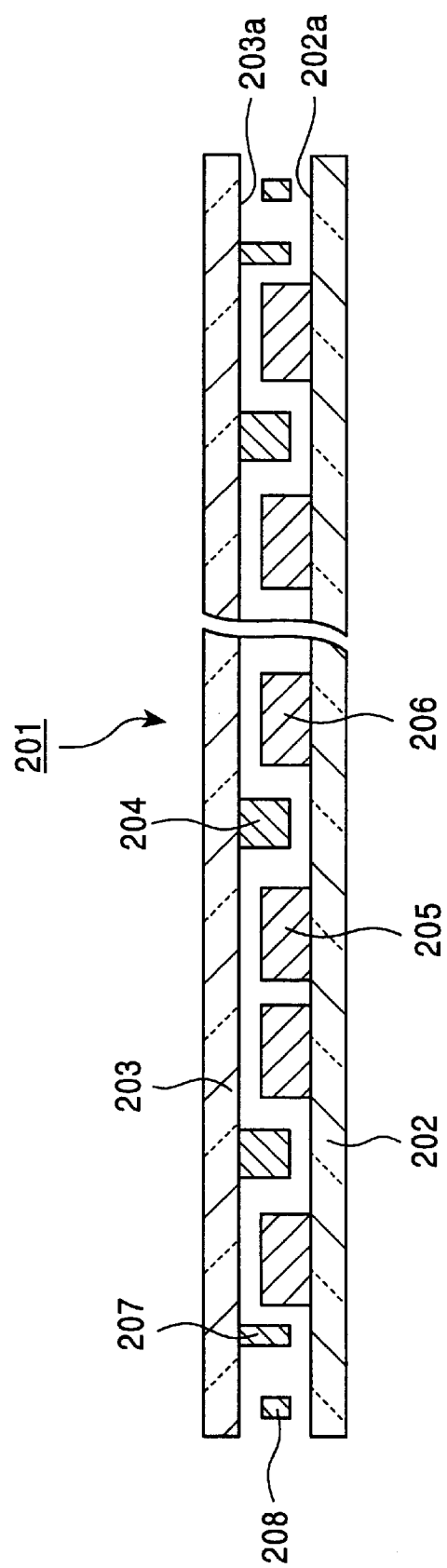
FIG. 11 is a longitudinal sectional view, taken along line XI—XI of FIG. 8.

The cutting position shown in FIGS. 9 and 10 is placed between the lower surface of a frame section and the upper surface of a fixed substrate that will be described later.

Figure 7:
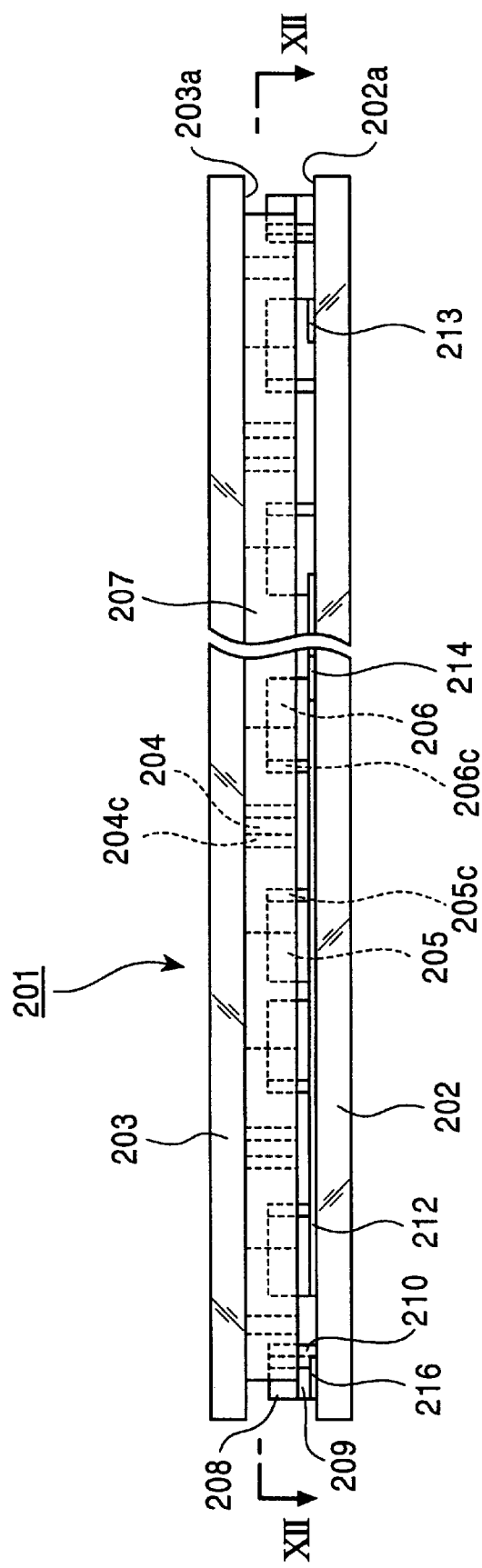
FIG. 7 is a front view of an electrostatic actuator according to a second embodiment of the present invention.
Figure 8:
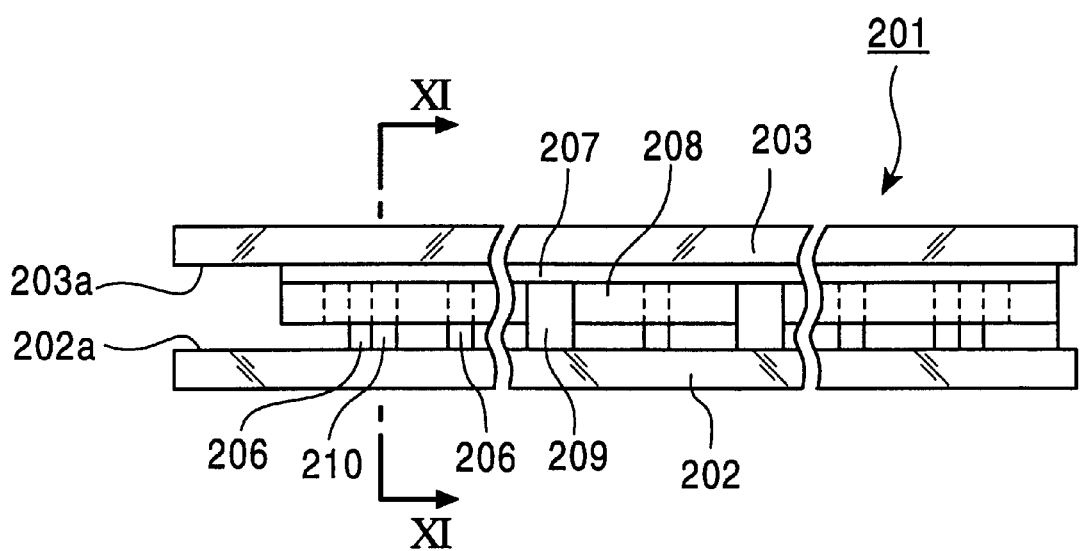
FIG. 8 is a side view of the electrostatic actuator.

Referring to FIGS. 7 and 8, a fixed substrate 202 and a movable substrate 203 are placed to be spaced opposed to each other. A movable electrode 204 is disposed on an inner surface (the surface facing the fixed substrate 202) 203a of the movable substrate 203, and fixed electrodes 205 and 206 are disposed on an inner surface (the surface facing the movable substrate 203) 202a of the fixed substrate 202. By applying voltage between the movable electrode 204 and the fixed electrodes 205 and 206, the movable substrate 203 is moved so that the movable electrode 204 approaches the fixed electrodes 205 and 206. The fixed substrate 202 and the movable substrate 203 are formed of a glass substrate, and the movable electrode 204 and the fixed electrodes 205 and 206 are made of a conductive material such as silicon.

Figure 12:
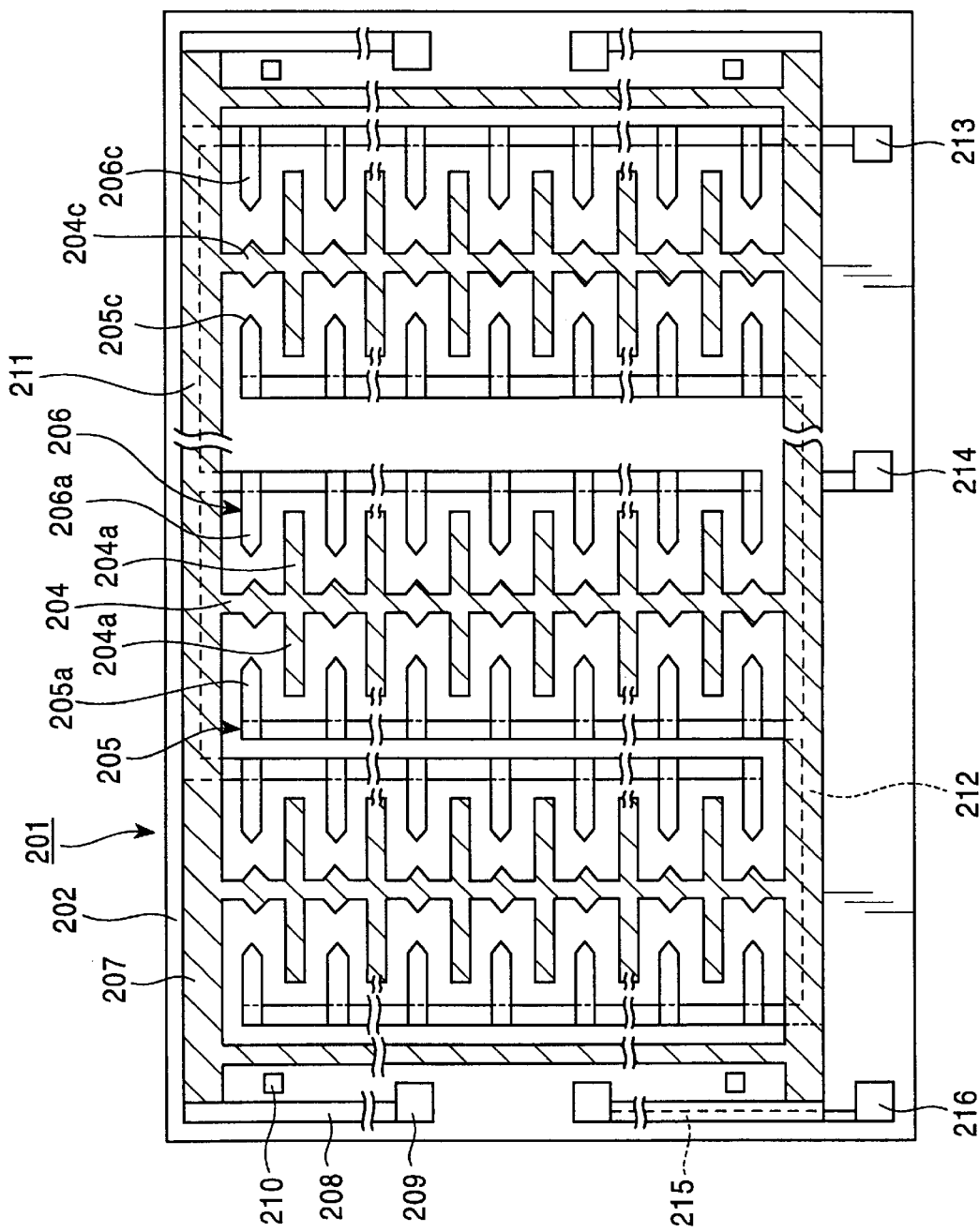
FIG. 12 is a horizontal sectional view, taken along line XII—XII of FIG. 7.
Figure 13:
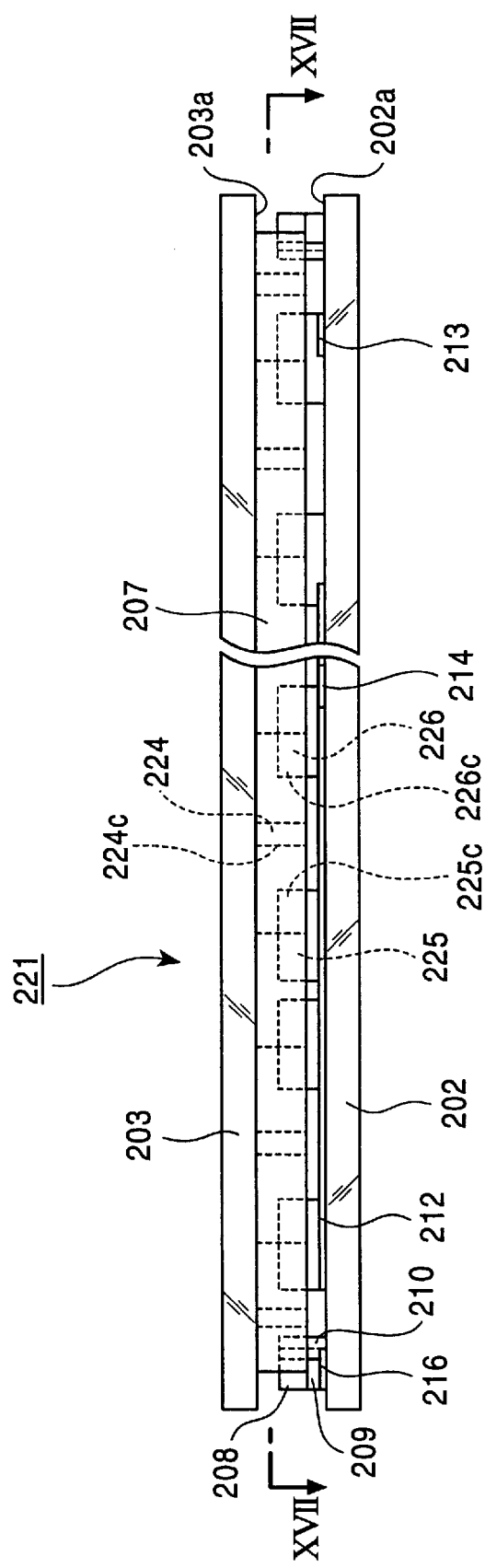
FIG. 13 is a front view of an electrostatic actuator according to a third embodiment of the present invention.
Figure 14:
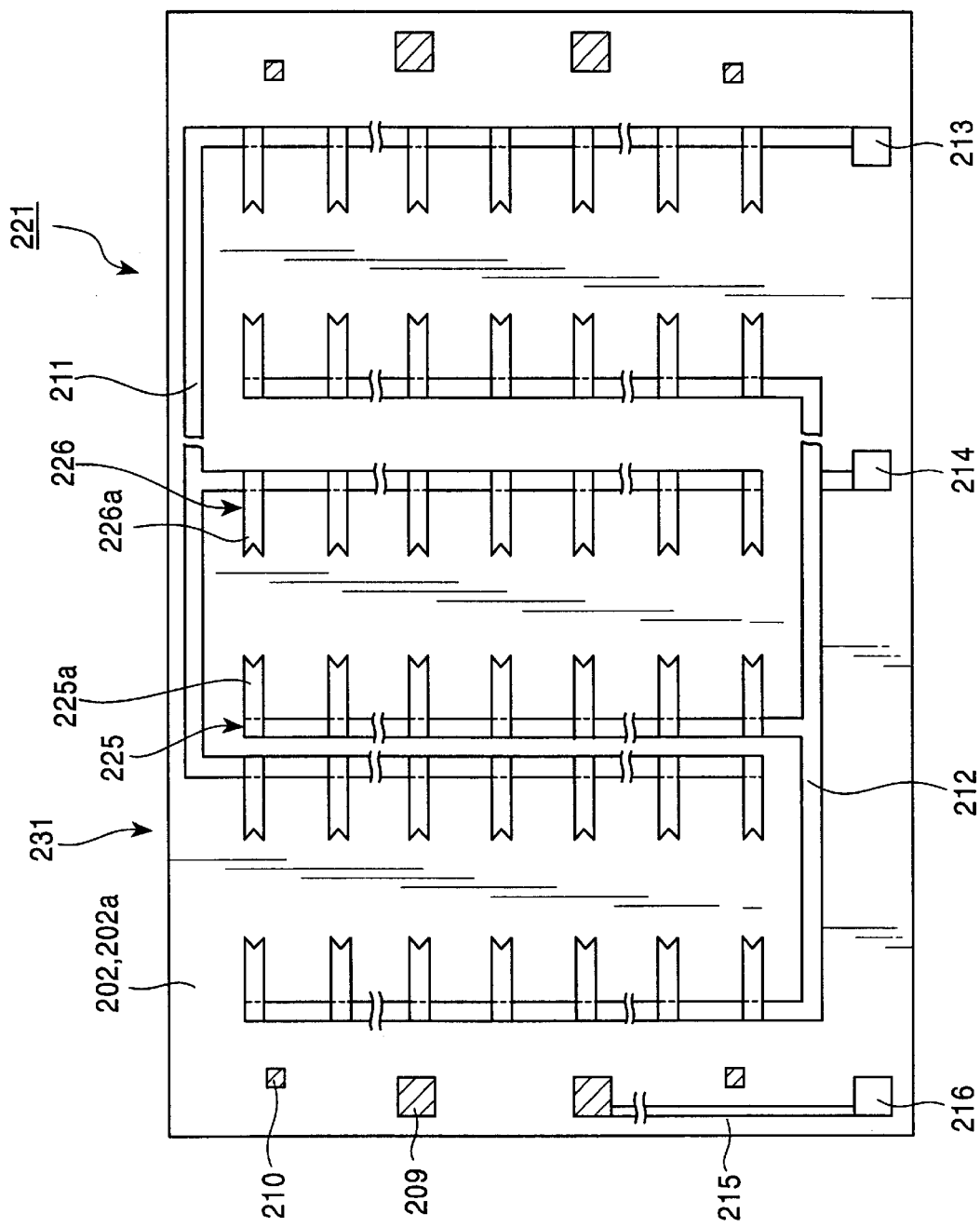
FIG. 14 is a plan view of a fixed substrate in the electrostatic actuator, as viewed from the top side.
Figure 15:
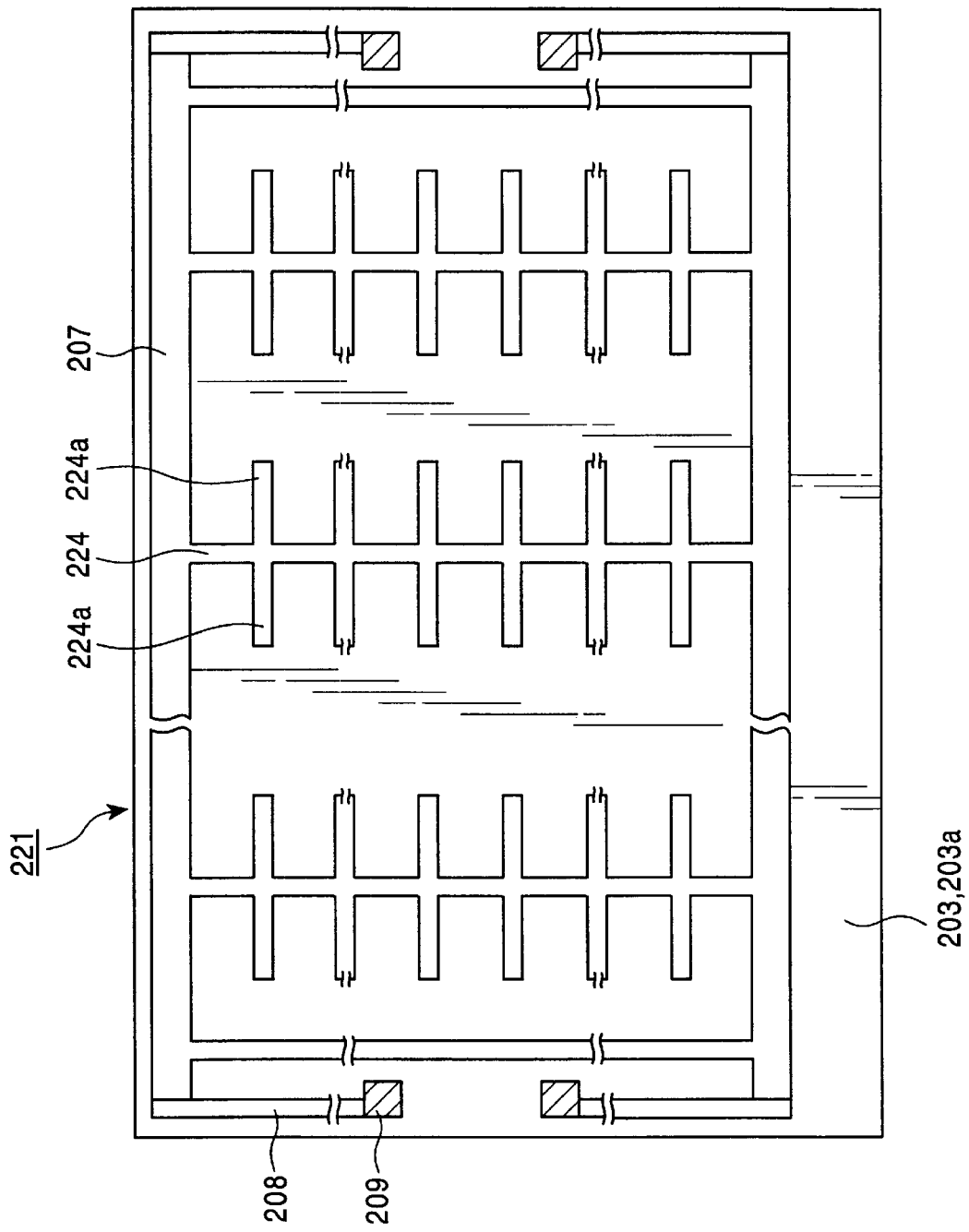
FIG. 15 is a plan view of a movable substrate in the electrostatic actuator, as viewed from the bottom side.
Figure 16:
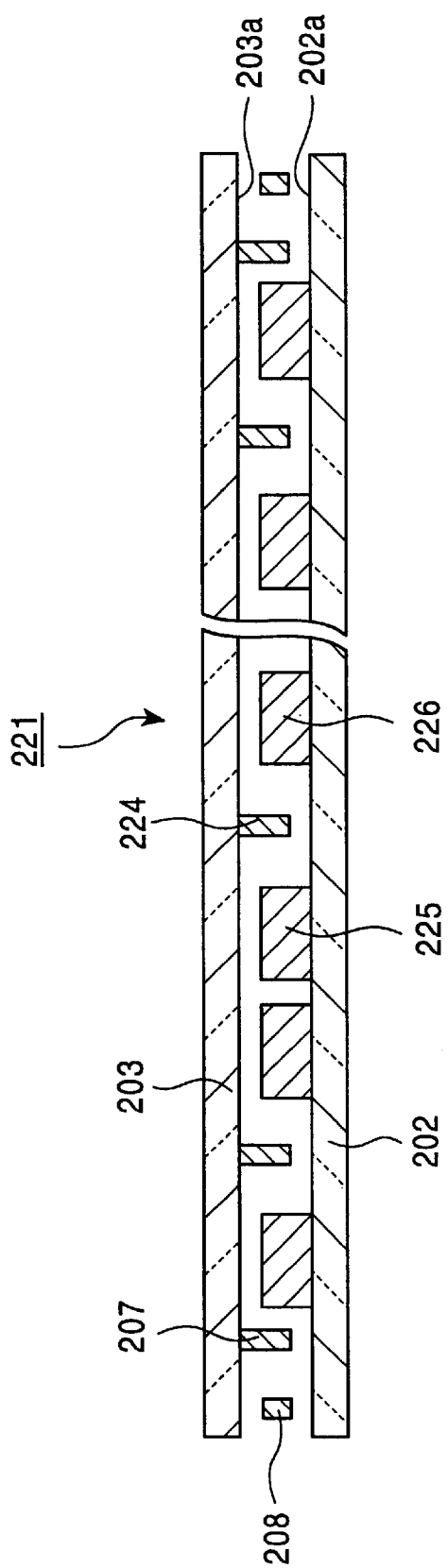
FIG. 16 is a longitudinal sectional view, taken along line XVI—XVI of FIG. 17.

As shown in FIGS. 10 and 12, the movable electrode 204 forms a comb-like structure, which includes a plurality of teeth 204a that are in parallel with each other. In contrast, as shown in FIGS. 9 and 12, the fixed electrodes 205 and 206 include a plurality of teeth 205a and 206a, respectively, that are arranged in parallel so as to be placed between the adjoining teeth 204a of the movable electrode 204. The movable electrode 204 has the teeth 204a that point to both the right and left sides of FIG. 12. The fixed electrodes 205 and 206 are arranged on both sides of the movable electrode 204. The fixed electrode 206 placed on the right side of the movable electrode 204 in the figure serves to move the movable substrate 203 in the rightward direction when voltage is applied, and the fixed electrode 205 placed on the left side serves to move the movable substrate 203 in the leftward direction when voltage is applied.

FIG. 12 shows the shapes of the engaging portions of the teeth 204a, 205a, and 206a of the movable electrode 204 and the fixed electrodes 205 and 206. When voltage is applied between the movable electrode 204 and the fixed electrodes 205 and 206, the movable substrate 203 moves in a direction such that the degree of engagement increases between the teeth 204a, 205a, and 206a, that is, in the longitudinal direction of the teeth. Regarding the side faces of the teeth 204a, 205a, and 206a that are parallel to the substrate moving direction, the side faces of the teeth 205a and 206a of the fixed electrodes 205 and 206 are partly opposed to the side faces of the teeth 204a of the movable electrode 204, while the teeth 205a and 206a of the fixed electrodes 205 and 206 extend outside the leading ends of the teeth 204a of the movable electrode 204. The length of such extending portions determines the moving distance of the substrate at the time of voltage application. On the other hand, approaching and separating faces 204c of the movable electrode 204 and approaching and separating faces 205c and 206c of the fixed electrodes 205 and 206, which are not parallel to each other, are formed so as to be vertical to the moving direction of the substrate and to approach each other when voltage is applied and to separate from each other when voltage is cut off. In this embodiment, the approaching and separating faces 204c, 205c, and 206c of the movable electrode 204 and the fixed electrodes 205 and the 206 are convexly shaped to taper off toward the end.

In the overall electrostatic actuator 201, a plurality of pairs formed by the single movable electrode 204 and the two fixed electrodes 205 and 206 are arranged in the substrate moving direction, as shown in FIG. 12. Silicon comprising the teeth 205a and 206a of the fixed electrodes 205 and 206 is disposed in isolation on the fixed electrodes 205 and 206, as shown in FIG. 9. Regarding silicon on the side of the movable substrate 204, all the movable electrodes 204 arranged in the substrate moving direction are connected to a rectangular frame section 207, as shown in FIG. 10. Support spring portions 208 extend from the corners of the frame section 207, and anchor portions 209 are provided at the leading ends thereof. That is, the movable electrodes 204, the frame section 207, the support spring portions 208, and the anchor portions 209 are integrally made of silicon. As shown in FIG. 12, stoppers 210 made of silicon are disposed between the support spring portions 208 and the frame section 207. The stoppers 210 are placed closer to the frame section 207 than to the anchor portions 209.

As described above, the movable electrode 204 is disposed on the inner surface 203a of the movable substrate 203, while the fixed electrodes 205 and 206 are disposed on the inner surface 202a of the fixed substrate 202. As shown in FIG. 10, the frame section 207 is also fixed on the inner surface 203a of the movable substrate 203, in a manner similar to the movable electrode 204. Although the support spring portions 208 extend from the frame section 207, they are not fixed to either the movable substrate 203 or the fixed substrate 202. Furthermore, as shown in FIG. 7, the anchor portions 209 at the leading ends of the support spring portions 208 are fixed on the inner surface 202a of the fixed substrate 202. That is, the anchor portions 209 are fixed on the fixed substrate 202, and the frame section 207 and the movable electrode 204 are fixed on the movable substrate 203 via the support spring portions 208, whereby the movable substrate 203 is supported with respect to the fixed substrate 202. The support spring portions 208, which are not fixed to either the movable substrate 203 or the fixed substrate 202, elastically deform because of the elasticity of silicon when the movable substrate 203 is moved by the application of voltage, and elastically return whereby the voltage is cut off so that the movable substrate 203 returns to the position before voltage was applied. The support spring portions 208 essentially function as springs.

Referring again to FIG. 9, a wire 211 is provided to electrically connect the teeth 206a of the fixed electrode 206 placed on the right side of the movable electrode 204 in order to move the movable substrate 203 rightward in the figure. Similarly, a wire 212 is provided to electrically connect the teeth 205a of the fixed electrode 205 placed on the left side of the movable electrode 204 in order to move the movable substrate 203 leftward. These wires 211 and 212 are provided with pad electrodes (a rightward movement electrode 213 and a leftward movement electrode 214), respectively, for connection to a power supply. The wires 211 and 212 are made of metal, such as aluminum, and are arranged on the inner surface 202a of the fixed substrate 202 so as to be in contact with the fixed electrodes 205 and 206, as shown in FIG. 9. Furthermore, a wire 215 extends to the anchor portion 209 on the fixed substrate 202 along one (the support spring portion 208 at the left bottom of FIG. 12) of the four support spring portions 208 shown in FIG. 12 so as to be electrically connected to the anchor portion 209 in order to apply voltage to the movable electrode 204 via the anchor portion 209, the support spring portion 208, and the frame section 207. The wire 215 is also provided with a pad electrode (a common electrode 216) for connection to the power supply.

An equipotential pattern (not shown) made of metal, such as aluminum, is formed on the portion of the movable substrate inner surface 203a above the region where silicon is disposed between the substrates, excluding silicon fixed on the movable substrate 203, for example, above the fixed electrodes 205 and 206, above the support spring portions 208, and above the anchor portions 209. In joining silicon to the movable substrate 203 by anode coupling in the manufacturing process, the equipotential pattern serves to make the potential of the surface of the substrate equal to that of silicon in order to prevent silicon from being undesirably joined to the movable substrate 203.

During use of the electrostatic actuator 201, a power supply is used that can output a voltage of at least approximately several tens of volts, a power supply terminal is connected to the rightward movement electrode 213 and the leftward movement electrode 214, and the common electrode 216 is grounded. For example, when a voltage of approximately several tens of volts is applied between the rightward movement electrode 213 and the common electrode 216, electrostatic attractive force is generated between the teeth 206a of the fixed electrode 206 on the right side of the movable electrode 204, and the teeth 204a of the movable electrode 204 via the wires 211 and 215. The electrostatic attractive force serves as driving force so as to move the movable substrate 203 in a direction such that the degree of engagement increases between the teeth 204a and 206a, that is, in the rightward direction in FIG. 12. With this movement of the movable substrate 203, the support spring portions 208 elastically deform, and the frame section 207 also moves rightward. When the frame section 207 abuts on the stoppers 210, the movable substrate 203 is stopped, and does not further move. By subsequently cutting off the voltage, the electrostatic attractive force between the teeth 206a of the fixed electrode 206 and the teeth 204a of the movable electrode 204 disappears, whereby the support spring portions 208 elastically return, and the movable substrate 203 returns to the position before voltage was applied. In order to move the movable substrate 203 leftward, similar operations are performed between the leftward movement electrode 214 and the common electrode 216.

In general, it is conceivable that electrostatic attractive force serving as driving force in this type of electrostatic actuator is the resultant of a force F1 that acts to increase the area of the opposing portions of the electrode faces in parallel with the direction of relative motion between the substrates when voltage is applied, and a force F2 that acts to cause the approaching and separating faces of the electrodes to attract each other when voltage is applied. In the electrostatic actuator 201 of this embodiment, the approaching and separating faces 204c, 205c, and 206c of the teeth 204a of the movable electrode 204 and the teeth 205a and 206a of the fixed electrodes 205 and 206 are convexly shaped to taper off toward the end, and are not parallel to each other. As a result, the force F2 of the above-described forces F1 and F2, by which the approaching and separating faces attract each other, is much smaller than that in the case in which the approaching and separating faces are parallel to each other. Accordingly, the total electrostatic attractive force (driving force) is substantially equal to F1 that is not affected by the positions of the electrodes at the time of approach and separation. Therefore, the electrostatic actuator 201 of this embodiment can make the driving force more constant, compared with the conventional actuator, which improves controllability, and is suitable for use as a positioning mechanism of a magnetic head device, or the like.

Furthermore, the movable electrode 204 and the fixed electrodes 205 and 206 are composed of a plurality of teeth, and constitute a plurality of pairs of electrodes. Therefore, the driving force of the overall actuator is the resultant of all the electrostatic attractive forces generated between the teeth 204a, 205a, and 206a, which provides a great driving force. Therefore, it is possible to achieve an electrostatic actuator having a great and constant driving force that is a requirement as element performance.

Next, an electrostatic actuator according to a third embodiment of the present invention will be described with reference to FIGS. 13 to 17. The electrostatic actuator 221 of the third embodiment is different from the second embodiment only in the shape of approaching and separating faces of electrode teeth that are not parallel to each other, and other structures are just the same as those in the second embodiment. Therefore, components in FIGS. 13 to 17 common to FIGS. 7 and 12 are denoted by the same numerals, and a description of the overall configuration is omitted.

Figure 17:
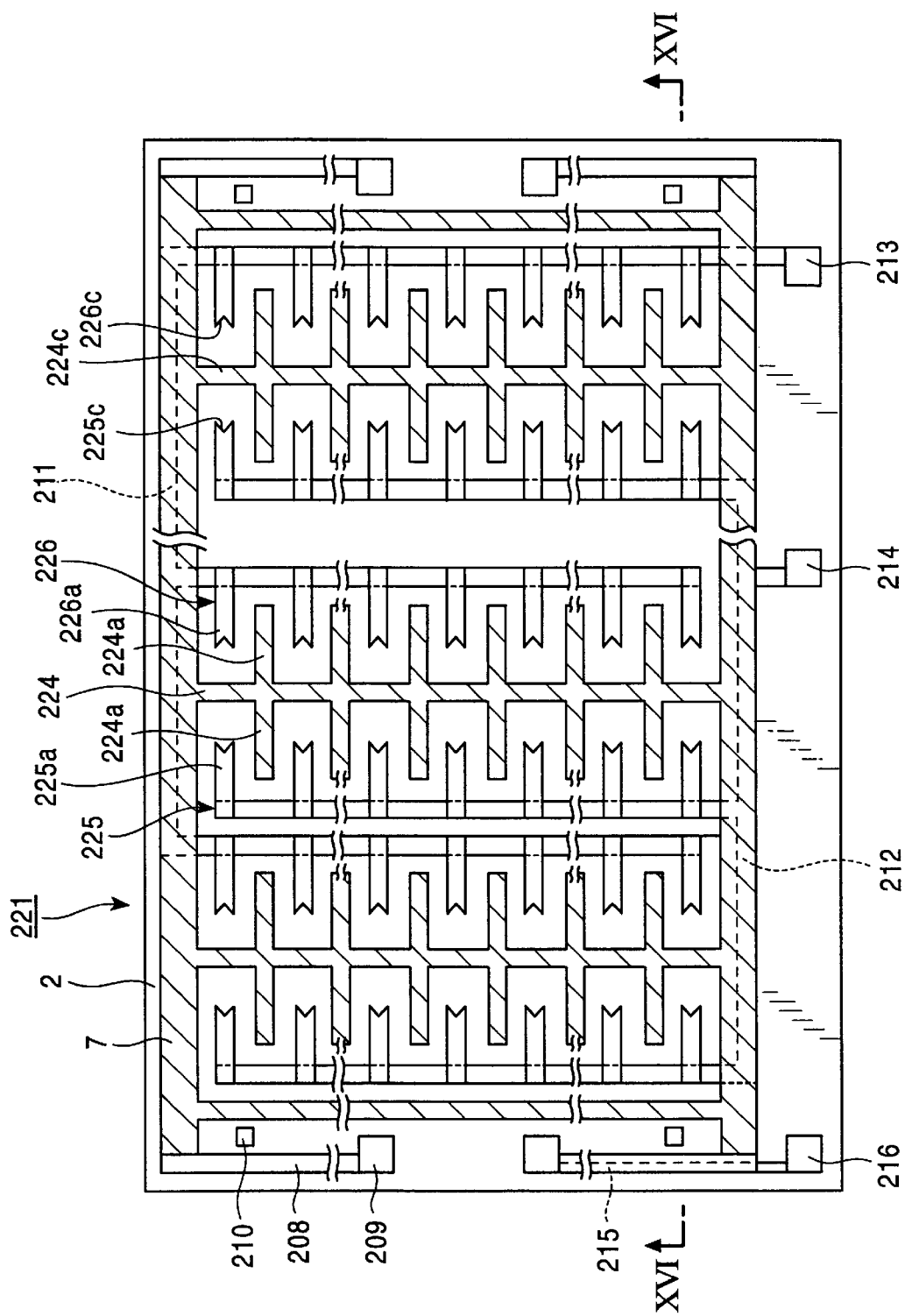
FIG. 17 Is a horizontal sectional view, taken along line XVII—XVII of FIG. 13.
Figure 18:
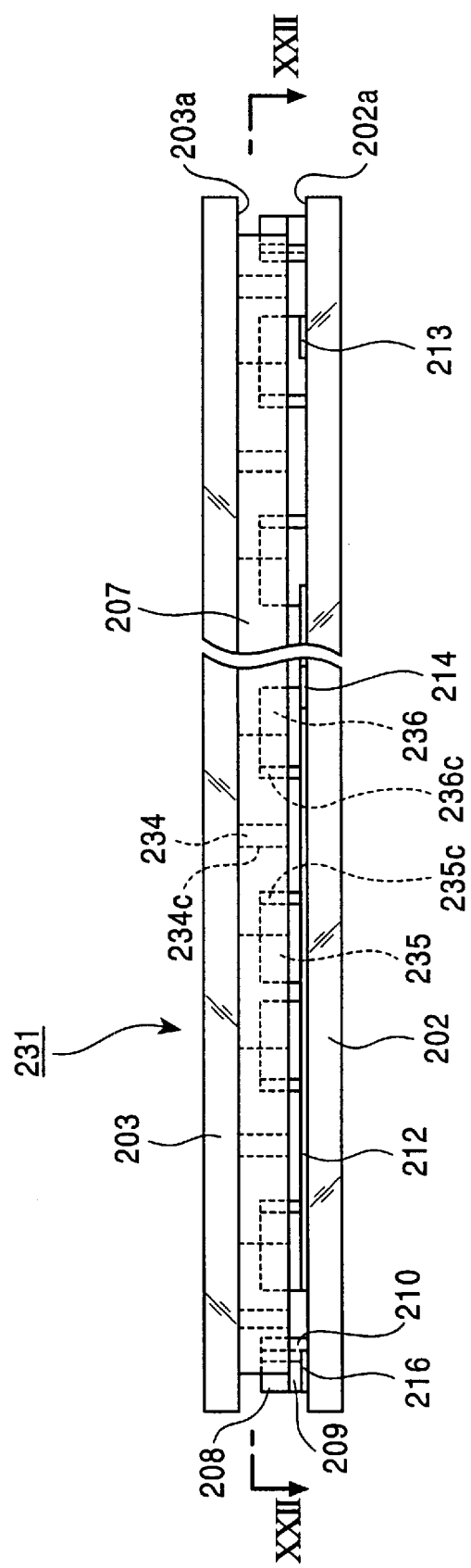
FIG. 18 is a front view of an electrostatic actuator according to a fourth embodiment of the present invention.
Figure 19:
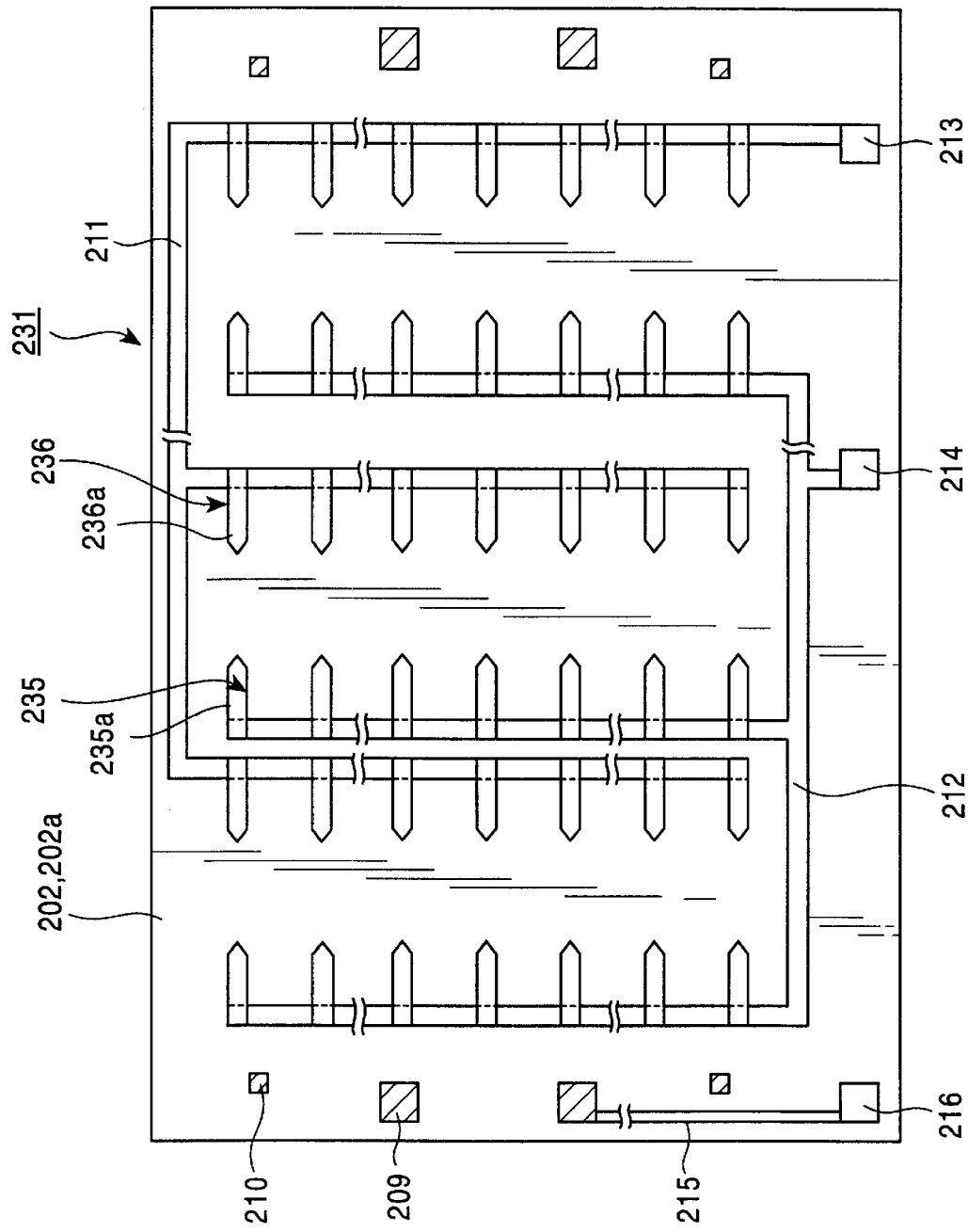
FIG. 19 is a plan view of a fixed substrate in the electrostatic actuator, as viewed from the top side.
Figure 20:
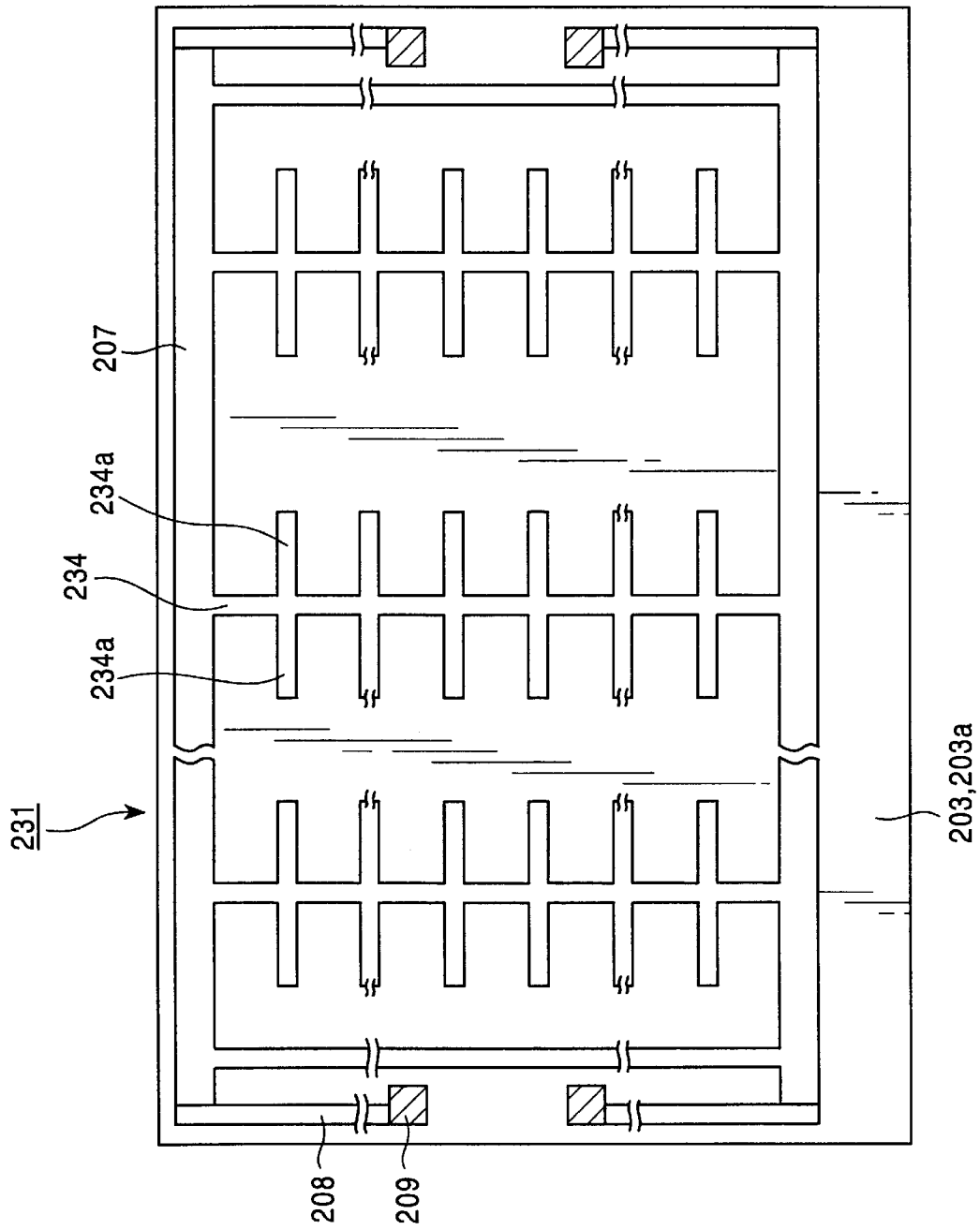
FIG. 20 is a plan view of a movable substrate in the electrostatic actuator, as viewed from the bottom side.
Figure 21:
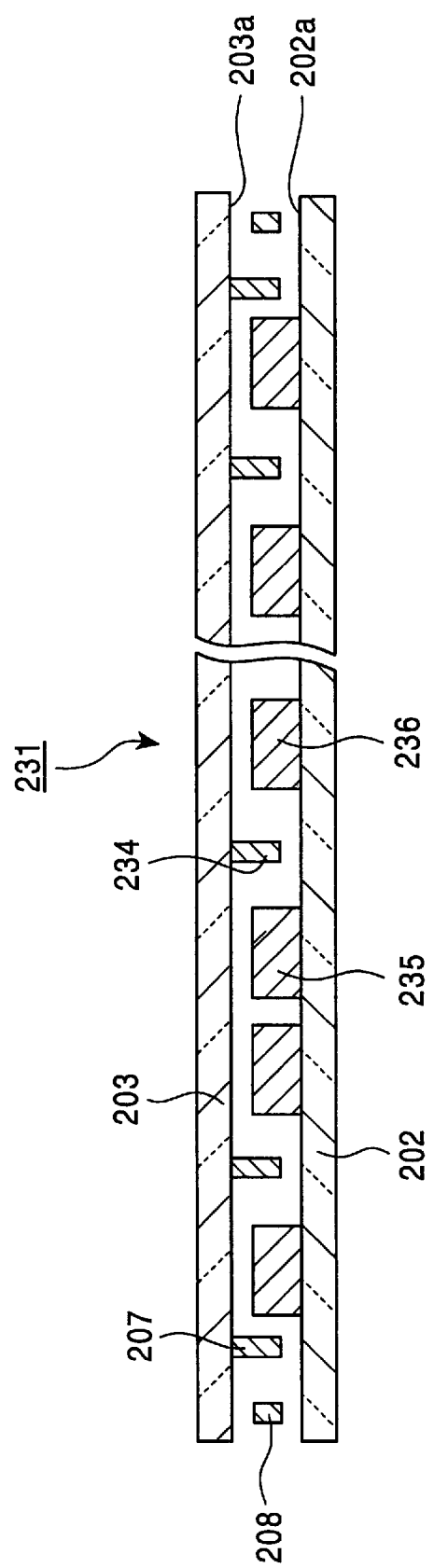
FIG. 21 is a longitudinal sectional view, taken along line XXI—XXI of FIG. 22.

FIG. 17 shows the shapes of the engaging portions of teeth of a movable electrode 224 and fixed electrodes 225 and 226. In this embodiment, approaching and separating faces 224c, 225c, and 226c of teeth 224a of the movable electrode 224 and teeth 225a and 226a of the fixed electrodes 225 and 226 are also not parallel to each other, whereas the faces 224c of the movable electrode 224 are flat, and the faces 225c and 226c of the fixed electrodes 225 and 226 are concavely shaped to broaden toward the end.

Next, a fourth embodiment of the present invention will be described with reference to FIGS. 18 to 22.

An electrostatic actuator 231 of the fourth embodiment is different from the second and third embodiments only in the shape of approaching and separating faces of electrode teeth that are not parallel to each other, and other structures are just the same as those in the second and third embodiments. Therefore, components in FIGS. 18 to 22 common to FIGS. 7 to 12 and 13 to 17 are denoted by the same numerals, and a description of the overall configuration is omitted.

Figure 22:
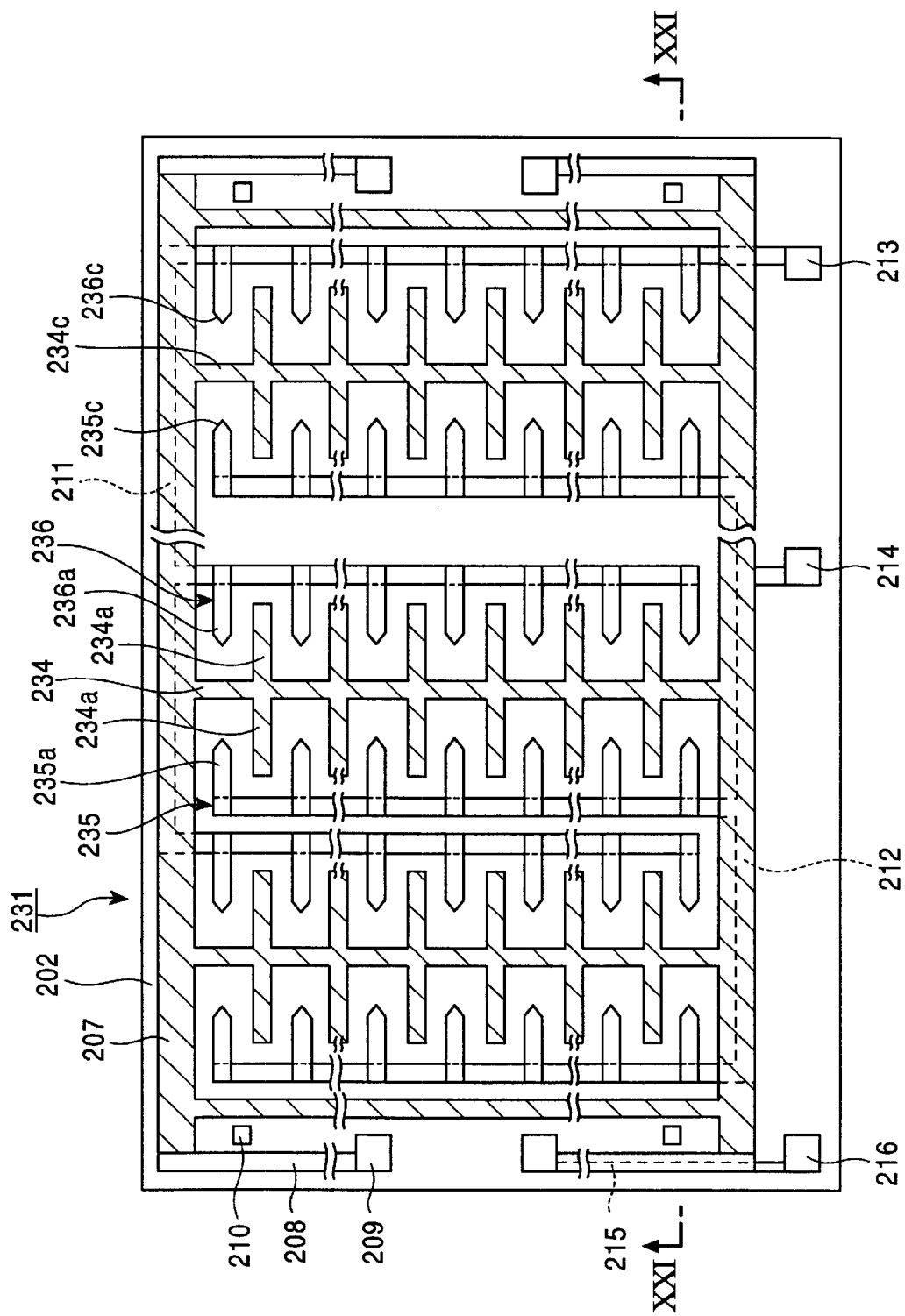
FIG. 22 is a horizontal sectional view, taken along line XXII—XXII of FIG. 18.

FIG. 22 shows the shapes of the engaging portions between teeth of a movable electrode 234 and fixed electrodes 235 and 236. As shown in this figure, approaching and separating faces 234c, 235c, and 236c of teeth 234a of the movable electrode 234 and teeth 235a and 236a of the fixed electrodes 235 and 236 are also not parallel to each other in this embodiment, whereas the faces 234c of the movable electrode 234 are flat, and the faces 235c and 236c of the fixed electrodes 235 and 236 are convexly shaped to taper off toward the end.

In the electrostatic actuators of the third and fourth embodiments, the approaching and separating faces of the teeth 224a and 234a of the movable electrode and the teeth 225a, 226a, 235a, and 236a of the fixed electrodes are also not parallel to each other. Therefore, in a manner similar to the second embodiment, it is possible to make the force F2, by which the approaching and separating faces attract each other, smaller, and to make the driving force more constant, than in the conventional actuator.

In the third and fourth embodiments, however, since the approaching and separating faces 224c and 234c of the movable electrode are flat, the effect of the force F2 is somewhat greater than that of the second embodiment, while the advantage of constant driving force is somewhat smaller than that of the second embodiment. On the other hand, in consideration of an increase of the force F1 that acts to increase the area of the opposing portions of the electrode faces parallel to the moving direction of the substrates when voltage is applied, and an increase of the force F2, the total driving force increases in the following order: the second embodiment, the fourth embodiment, and the third embodiment.

In contrast to the fourth embodiment in which the approaching and separating faces of the electrodes are convexly shaped to taper off toward the end, the approaching and separating faces of the electrodes are concavely shaped to broaden toward the end in the third embodiment. Since there are no projecting portions at the leading ends of the teeth, the number of teeth that can be formed in the same area can be increased, which also increases the driving force.

Furthermore, the approaching and separating faces of the electrodes that are not parallel may take various forms other than the above-described forms, such as tapering projecting faces and tapering projecting faces, broadening concave faces and flat faces, and tapering projecting faces and flat faces. In order to make the driving force as constant as possible, it is preferable to eliminate the portions that are approximately parallel.

Next, a description will be given of an example of a magnetic recording apparatus using the microactuator of the first embodiment.

Figure 23:
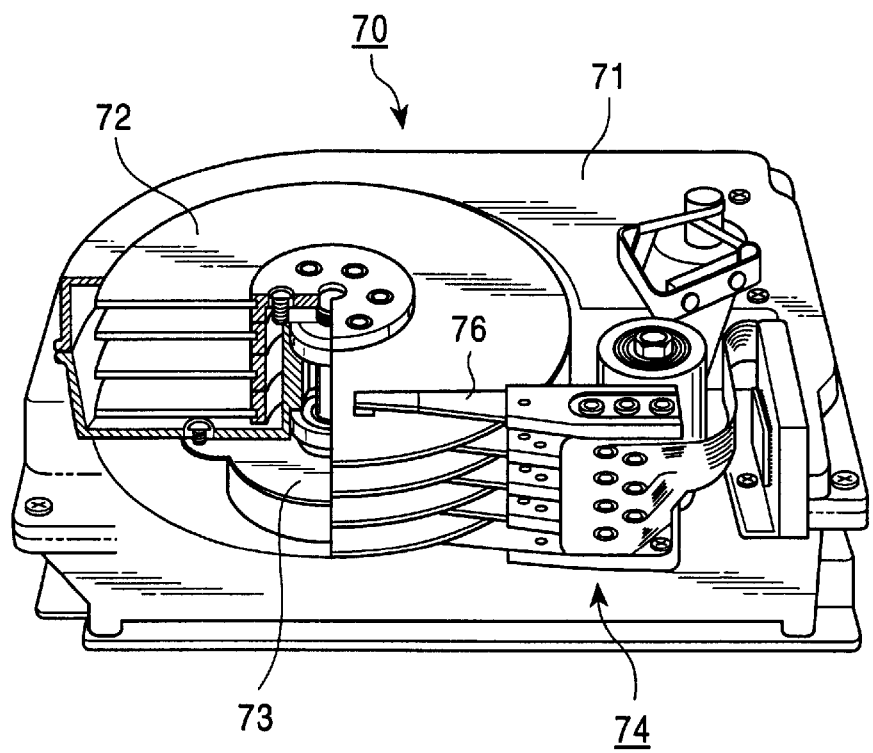
FIG. 23 is a perspective view of a hard disk apparatus using the microactuator.

FIG. 23 shows an example of a hard disk apparatus that is a kind of magnetic recording apparatus. As shown in FIG. 23, a plurality of magnetic disks 72 (magnetic recording media) are contained in a casing 71 of a hard disk apparatus 70. Data is to be recorded on a magnetic substance layer formed on the surface of each of the disks 72, and several hundreds to several thousands of recording tracks having a width of approximately 2 $\mu$m are provided on both surfaces of the disks 72. Moreover, a driving motor 73 is placed to rotate the disks 72.

Figure 24:
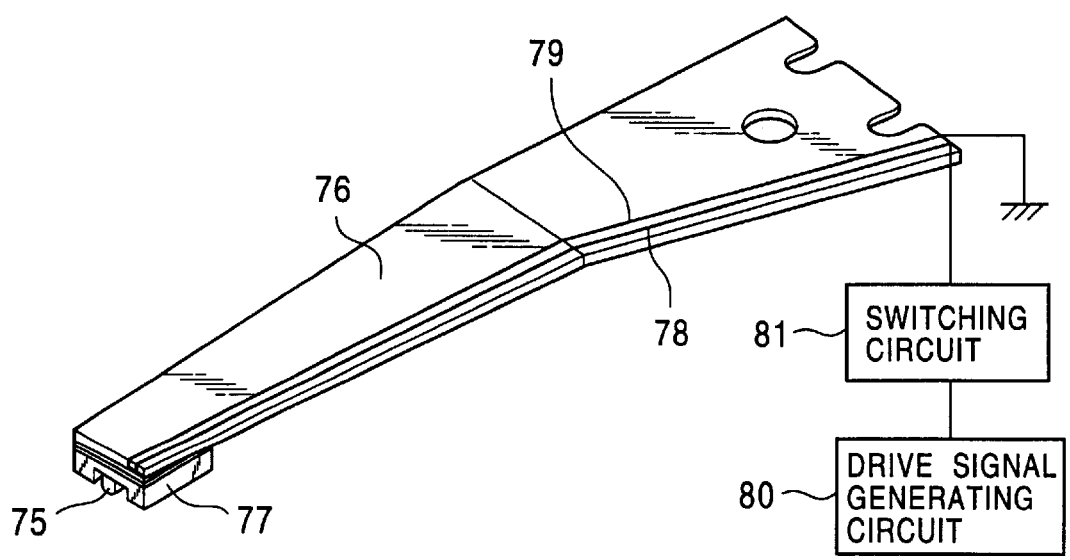
FIG. 24 is a perspective view of a magnetic head device in the hard disk apparatus.
Figure 25:
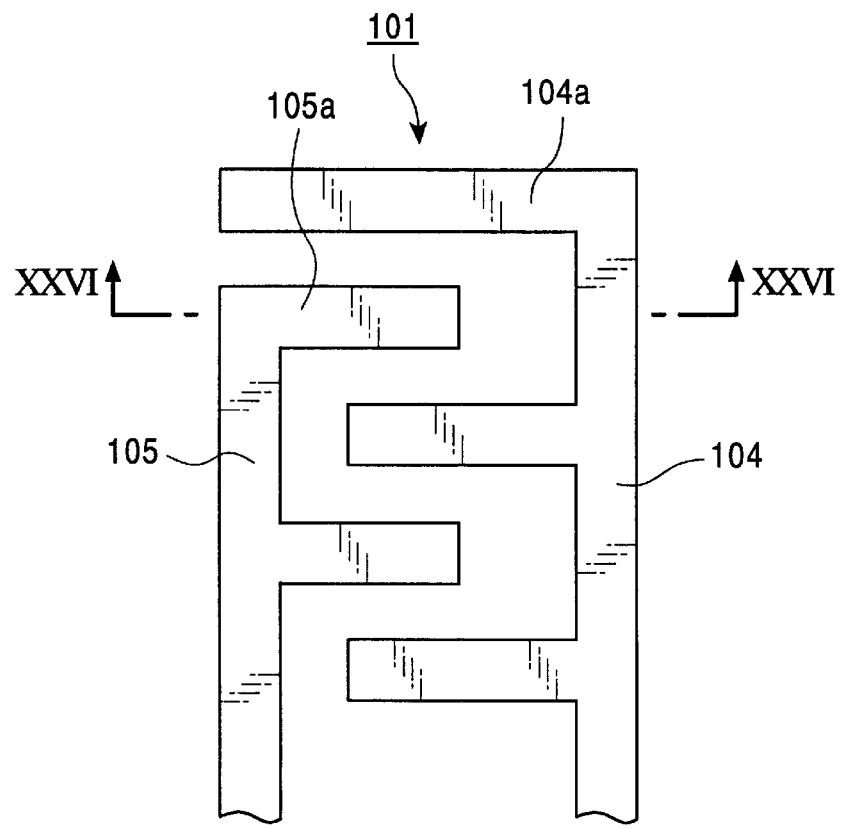
FIG. 25 is a plan view of a conventional electrostatic actuator.
Figure 26:
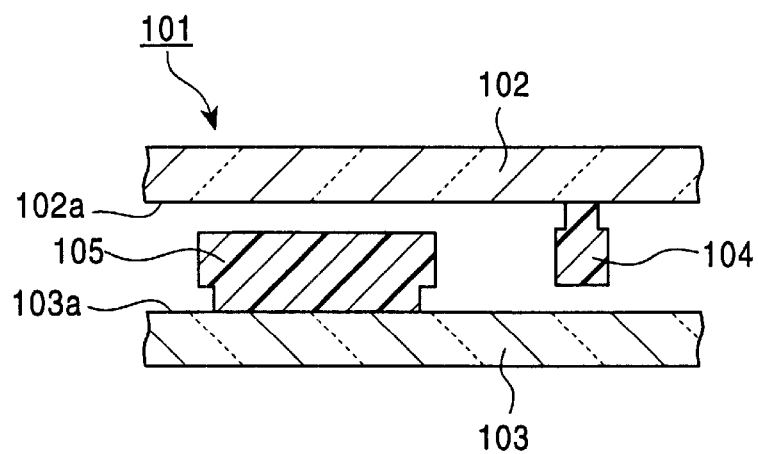
FIG. 26 is a sectional view, taken along line XXV—XXV of FIG. 25.

A magnetic head device 74 is disposed adjacent to the disks 72 inside the casing 71. The magnetic head device 74 includes a plurality of magnetic heads 75 corresponding to the plurality of disks 72. As shown in FIG. 24, each of the magnetic heads 75 is fixed to the leading end of a gimbal 76 that is formed of a thin metal plate having spring properties, and moves on the disk 72 in the radial direction in response to actuation of a voice coil motor. The magnetic head 75 is of a so-called CSS (Contact Start Stop) type that lands on the surface of the disk 72 when the disk 72 remains stationary, and rises above the disk surface while the disk is rotating. A slider 77 is disposed at the leading end of the gimbal 76 so as to raise the magnetic head 75 by air current during the rotation of the disk, and the magnetic head 75 is supported with respect to the slider 77.

The microactuator 1 according to the above-described embodiment is interposed between the gimbal 76 and the slider 77. That is, the fixed substrate 2 of the microactuator 1 is fixed to the gimbal 76 while the movable substrate 3 is fixed to the slider 77. The microactuator 1 is fixed so that the moving direction of the movable substrate 3 points to the widthwise direction of the gimbal 76. The gimbal 76 is provided with a wire (not shown) for data transfer from and to the magnetic head 75, six voltage application wires 78 (shown by a single solid line on the gimbal 76 for convenience of illustration) for applying voltage to the fixed electrodes 5 to 10 of the actuators 36, 37, and 38, and a wire 79 for grounding the common electrode 28 connected to the movable electrodes 41 to 43.

The magnetic head device 74 also includes a drive signal generating circuit 80 for generating therein a voltage (signal) for driving the microactuator 1, and a switching circuit 81 for switching among the six voltage application wires 78 to which a signal is supplied from the drive signal generating circuit 80.

In the hard disk apparatus 70 of this embodiment, the magnetic head 75 is positioned with respect to a predetermined track on the magnetic disk 72 (tracking) in response to the operation of the voice coil motor, and the position of the magnetic head 75 is finely adjusted by the action of the microactuator 1 mounted at the leading end of the gimbal 76. In this case, since the microactuator 1 can perform stepwise motion by switching among the actuators, as described above, the magnetic head device 74 need not have any complicated shift amount control system, and it is possible to finely adjust the head position with only the simple switching circuit 81 by the stepwise motion of the microactuator 1. That is, the adoption of the microactuator 1 of this embodiment makes it possible to simplify the configuration of the magnetic head device 74.

The technical field of the present invention is not limited to the above-described embodiments, and various modification are possible without departing from the scope of the invention. For example, in the above embodiments, the three actuators that provide different shift amounts are arranged, in which teeth are formed on both sides of the movable electrode, and the fixed electrode is placed inside the teeth so that the movable substrate can move in both directions. This structure allows seven-step motion. In contrast, for example, a plurality of actuators for providing different shift amounts may be used, in which teeth are formed on one side of the movable electrode and the movable substrate can move only in one direction.

In the above embodiment, as a means for giving different shift amounts to the actuators, the movable electrodes in the actuators have the same size, and the fixed electrodes are different in size, whereby the portions of the fixed electrode teeth that extend outside the leading ends of the teeth of the movable electrode are made different in length among the actuators. Instead of this structure, the portions of the fixed electrode teeth that extend outside the leading ends of the teeth of the movable electrode may be made different in length among the actuators by forming the fixed electrodes in the same size and making the teeth of the movable electrodes different in length among the actuators. The shift may be performed in steps of an arbitrary amount, such as 0.5 $\mu$m, instead of 1 $\mu$m adopted in the above embodiments.

While the stoppers are provided to limit the movement of the movable substrate in the above embodiments, the number and position of the stoppers may be appropriately changed. Furthermore, the anchor portions may also function as stoppers. The number of pairs of movable electrodes and fixed electrodes, the number of teeth constituting the electrodes, and specific sizes and materials of the portions, the specific manufacturing method, and the like may also be appropriately changed. The electrostatic actuator of the present invention is, of course, applicable to various fields in which micromovement of components is required, other than the magnetic head device and the magnetic recording apparatus.

As described in detail above, the microactuator of the present invention includes a plurality of actuators that are disposed on the substrate to change the relative moving distance of the substrates, and the relative moving distance can be controlled by switching among the actuators to be operated. Therefore, there is no need to adjust the applied voltage in order to control the shift amount of the substrate. According to the magnetic head device and the magnetic recording apparatus of the present invention including the microactuator, it is possible to control the shift amount of the microactuator by only employing a simple switching means, such as a switch, without using a complicated shift amount control system. This can make the device configuration simpler than before.

What is claimed is:

1. A microactuator wherein opposing substrates are spaced so as to move relative to each other, and a plurality of actuators for providing different distances of relative motion between said substrates are arranged between said substrates at predetermined intervals in the direction of relative motion between said substrates, and wherein the plurality of actuators are disposed so that the distances of relative motion between said substrates gradually increase in the one direction of relative motion between said substrates, but gradually decrease in a direction opposite to the one direction of relative motion, further wherein each of said actuators comprises a plurality of first comb-like electrodes formed on the opposing surface of a first substrate that is one of said substrates, and having a plurality of parallel teeth which have the same length and are aligned at the leading ends thereof; and a second electrode formed on the opposing face of a second substrate that is the other substrate, and having a plurality of parallel teeth aligned at the outer ends thereof so as to be placed between the adjoining teeth of each of said plurality of first electrodes and to extend outward from similar locations from the inner back side of lines which connect the leading ends of said teeth of each of said first electrodes in an undriven state, the outer ends of extending portions of said plurality of teeth being moved to the leading ends of said teeth of said first electrodes in a driven state in order to cause said substrates to move relative to each other, wherein said outwardly extending portions of said second electrode teeth are different in length among said actuators, and wherein the lengths of said second electrode teeth of said plurality of actuators gradually vary, respectively, in a direction in which said plurality of actuators are disposed so that the distances of relative motion between said substrates gradually increase in the one direction of relative motion between said substrates, but gradually decrease in a direction opposite to the one direction of relative motion.

2. A magnetic head device comprising a microactuator claimed in claim 1.

3. A magnetic recording apparatus comprising a magnetic head device claimed in claim 2.

4. A microactuator according to claim 1, wherein, in the plurality of actuators, the leading surfaces of the plurality of teeth of the first electrodes, and an approaching and separating face are formed so as not to be parallel to each other, with the approaching and separating face opposing the leading ends of the teeth of the first electrodes and approaching and separating while opposing the leading surface of the plurality of teeth of the first electrodes at a connection portion of the second electrode where the plurality of teeth of the second electrode are consecutively formed.

5. A microactuator according to claim 4, wherein the leading ends of the plurality of teeth of the first electrodes have planar convex shapes which taper off towards the leading ends, and wherein the approaching and separating face has a planar convex shape which protrudes and tapers off towards the leading ends of the first electrodes, with the approaching and separating face approaching and separating while opposing the leading surfaces of the plurality of teeth of the first electrodes at the connection portion of the second electrode.

6. A microactuator according to claim 4, wherein the leading ends of the plurality of teeth of the first electrodes have planar concave shapes which broaden towards the leading ends, and wherein the approaching and separating face is a flat face, with the approaching and separating face approaching and separating while opposing the leading surfaces of the plurality of teeth of the first electrodes at the connection portion of the second electrode.

7. A microactuator according to claim 4, wherein the leading ends of the plurality of teeth of the first electrodes have planar convex shapes which taper off towards the leading ends, and wherein the approaching and separating face is a flat face, with the approaching and separating face approaching and separating while opposing the leading surfaces of the plurality of teeth of the first electrodes at the connection portion of the second electrode.

8. A microactuator wherein opposing substrates are spaced so as to move relative to each other, and a plurality of actuators for providing different distances of relative motion between said substrates in the same direction of movement are arranged between said substrates at predetermined intervals in the direction of relative motion between said substrates, further wherein each of said actuators for providing different distances of relative motion between said substrates in the same direction of movement comprises a first comb-like electrode formed on the opposing face of a first substrate that is one of said substrates, and having a plurality of parallel teeth aligned at the leading ends thereof; and a second electrode formed on the opposing face of a second substrate that is the other substrate, and having a plurality of parallel teeth at the outer ends thereof so as to be placed between the adjoining teeth of said first electrodes and to extend outside the leading ends of said teeth of said first electrode in an undriven state, the outer ends of extending portions of said plurality of teeth being moved to the leading ends of said teeth of said first electrode in a driven state in order to cause said substrates to move relative to each other, and wherein said outside extending portions of said second electrode teeth are different in length among said actuators.

* * * * *